United States Patent [19]
Dearth

[11] Patent Number: 5,907,695
[45] Date of Patent: May 25, 1999

[54] DEADLOCK AVOIDANCE MECHANISM FOR VIRTUAL BUS DISTRIBUTED HARDWARE SIMULATION

[75] Inventor: Glenn A. Dearth, Groton, Mass.

[73] Assignee: Sun Microsystems, Inc., Palo Alto, Calif.

[21] Appl. No.: 08/621,777

[22] Filed: Mar. 22, 1996

[51] Int. Cl.$^6$ .................................................. G06F 15/20
[52] U.S. Cl. .................................................. 395/500
[58] Field of Search ..................... 395/500, 800; 364/209, 900, 578, 488, 489, 131, 133, 490, 240; 371/23

[56] References Cited

U.S. PATENT DOCUMENTS

| | | | |
|---|---|---|---|
| 4,821,173 | 4/1989 | Young et al. ........................... | 364/578 |
| 4,937,827 | 6/1990 | Beck et al. .............................. | 364/578 |
| 5,185,865 | 2/1993 | Pugh ....................................... | 395/275 |
| 5,327,361 | 7/1994 | Long et al. ............................. | 395/500 |
| 5,455,928 | 10/1995 | Herlitz .................................... | 395/500 |

OTHER PUBLICATIONS

Ososanya et al., VLSI Design of a Bus Arbitration Module for the 68000 Series of Microprocessors, IEEE, pp. 398–402, Apr. 10, 1994.

Coelho, A VHDL Standard Package for Logic Modeling, IEEE, pp. 25–32, Jun. 1990.

Taub, Corrected Settling Time of the Distributed Parallel Arbiter, IEEE, pp. 348–354, Jul. 1992.

*Primary Examiner*—Kevin J. Teska
*Assistant Examiner*—Matthew Loppnow
*Attorney, Agent, or Firm*—James D. Ivey

[57] ABSTRACT

To simulate a bus of a circuit, a number of virtual bus stubs ("VBSs") each post simulated bus signals as a single step and execution of the simulation system which includes such a VBS continues. As a subsequent, separate step, the VBS substantially immediately thereafter reaps a resolved simulated bus state. Synchronization in such a system is achieved by grouping into zones all VBSs which collectively represent the simulated state of a single bus. Each VBS has one of four states, namely, reap running, reap stopped, post running, post stopped. When a VBS posts, it is determined whether any other VBS of the same zone has yet to reap a previously resolved simulated bus state. If such a VBS exists, the posting VBS moves from reap running state to a post stopped state and execution of the simulation system containing the posting VBS is suspended until the last VBS of a zone reaps the previously resolved simulated bus state. Otherwise, if all VBSs of the same zone have reaped the previously resolved simulated bus state, the posting VBS moves from a reap running state to a post running state and execution of the simulation system containing the posting VBS continues. When a VBS reaps, it is determined whether any other VBS of the same zone has yet to post simulated bus signals for the current resolution of the simulated bus state. If such a VBS exists, the reaping VBS moves from post running state to a reap stopped state and execution of the simulation system containing the reaping VBS is suspended until the last VBS of a zone posts simulated bus signals for the current resolution of the simulated bus state. Otherwise, if all VBSs of the same zone have reaped simulated bus signals for the current resolution of the simulated bus state, the reaping VBS moves from a post running state to a reap running state and execution of the simulation system containing the reaping VBS continues.

16 Claims, 17 Drawing Sheets

DEADLOCK AVOIDANCE MECHANISM FOR VIRTUAL BUS DISTRIBUTED HARDWARE SIMULATION

CROSS-REFERENCE TO RELATED APPLICATIONS

The following copending U.S. Patent Applications are related to the present disclosure and the disclosures thereof are incorporated herein by reference: (i) a copending U.S. patent application Ser. No. 08/620,439 for "Interface for Interfacing Simulation Tests Written in a High-Level Programming Language to a Simulation Model" by Glenn A. Dearth, Paul M. Whittemore, David A. Medeiros, George R. Plouffe, Jr., and Bennet H. Ih filed on Mar. 21, 1996 (hereinafter in "Interface Application"), (ii) a copending U.S. patent application Ser. No. 08/621,775 for "Virtual Bus for Distributed Hardware Simulation" by Glenn A. Dearth and Paul M. Whittemore filed on Mar. 21, 1996 (hereinafter the "Virtual Bus Application"), (iii) a copending U.S. patent application Ser. No. 08/621,818 for "Device Reservation Mechanism for Distributed Hardware Simulation" by Glenn A. Dearth filed on Mar. 21, 1996 (hereinafter the "Reservation Application"), (iv) a copending U.S. patent application Ser. No. 08/621,776 for "Object-Oriented Development Framework for Distributed Hardware Simulation" by Glenn A. Dearth and Bennet H. Ih filed on Mar. 21, 1996 (hereinafter the "Framework Application"), and (v) a copending U.S. patent application Ser. No. 08/621,816 for "Synchronization Mechanism for Distributed Hardware Simulation" by Paul M. Whittemore and Glenn A. Dearth filed on Mar. 21, 1996 (hereinafter the "Synchronization Application").

FIELD OF THE INVENTION

The present invention relates to computer simulation of electronic circuitry and, in particular, to a method and apparatus for preventing deadlock situations in simulation of complex circuitry using models distributed over a computer network.

BACKGROUND OF THE INVENTION

In designing complex circuitry such as application-specific integrated circuits ("ASICs"), the designed logic of such circuitry is typically simulated in a computer using data and computer programs to thereby test the viability and accurate performance of the designed logic. By doing so, design flaws can be detected prior to expending the time and engineering and financial resources required to physically build the circuitry. To simulate circuitry using data and computer programs, the circuitry is described in a hardware description language ("HDL") to form a model. One example of an HDL is the Verilog HDL processed by the Cadence Verilog hardware simulator available from Cadence Design Systems, Inc. of San Jose, Calif. The HDL model of a circuit typically includes a description of components of the state of the circuit and a description of the behavior of the circuit. The behavior of the circuit generally includes inter-relationships between various components of the state of the circuit.

A hardware simulator then uses the HDL model of the circuitry to simulate the circuitry. The hardware simulator is a computer process which accepts data defining signals to be placed on certain parts of the simulated circuit and then changes the state of the circuit in accordance with the signals. The certain parts of the circuit include, for example, terminals, lines, or registers of the simulated circuit.

Circuitry which is simulated in this manner is becoming increasingly complex reducing significantly the feasibility of simulation of such circuitry on a single computer processor. Factors which contribute significantly to such reduction in feasibility in simulations of particularly complex circuits include intolerable amounts of time and computer resources which are required for such complex simulations to execute. For example, simulating a particularly complex circuit in a single computer may require more memory than is available within the single computer. The Virtual Bus Application describes a mechanism by which a complex circuit is divided into multiple circuit parts according to portions of the complex circuit which interact with one another through a bus and the circuit parts are simulated by individual models which can execute of multiple constituent computers of a computer network. According to the mechanism described in the Virtual Bus Application, the bus is simulated collectively by a number of virtual bus stubs, each of which is associated with and interacts with a respective model of a circuit part, and a resolver. The resolver collects simulated bus signals from each of the virtual bus stubs, resolves from the collected simulated bus signals a single, resolved simulated state of the bus, and transmits to each of the virtual bus stubs simulated bus signals corresponding to the resolved simulated bus state.

In simulating particularly complex circuits, the mechanism described in the Virtual Bus Application is susceptible to deadlock situations. The following example is illustrative. Circuit 100 (FIG. 1) includes circuit parts 102A–C. Circuit parts 102A–C are coupled to, and communicate with one another through, a bus 106. In addition, circuit parts 102A and 102B are coupled to, and communicate with one another through, a bus 104. A distributed simulation 200 of circuit 100 is shown in FIG. 2. Bus 106 (FIG. 1) is represented by virtual bus stubs ("VBSs") 206A–C (FIG. 2) of simulation systems 208A–C, respectively. Simulation systems 208A–C include circuit models 202A–C, respectively, which represent circuit parts 102A–C (FIG. 1), respectively. Bus 104 (FIG. 1) is represented by VBSs 204A (FIG. 2) and 204B of simulation systems 208A and 208B, respectively.

A deadlock situation can occur as follows. Assume that VBS 206A and VBS 204B post simulated bus signals corresponding to busses 106 and 104, respectively, at precisely the same simulation time. As a result of posting by VBS 206A, execution of simulation system 208A is suspended pending posting by VBSs 206B and 206C of simulated bus signals corresponding to bus 106. However, VBS 206B cannot post such simulated bus signals because execution of simulation system 208B is suspended pending posting by VBS 204A of simulated bus signals corresponding to bus 104 as a result of posting by VBS 204B. As described above, execution of simulation system 208A is suspended, so VBS 204A cannot post such simulated bus signals. Simulation 200 is therefore deadlocked. Deadlock is a catastrophic error and must be either resolved so that execution of simulation 200 can proceed or avoided altogether.

A number of deadlock resolution mechanisms are known; however, such mechanisms are generally quite complex and expensive, in terms of time, effort, and computer resources, to implement. A number of deadlock avoidance mechanisms are also known; however, characteristics of hardware simulation make implementation of conventional deadlock avoidance mechanisms particularly difficult. Specifically, engineers which implement simulations such as distributed simulation 200 often program stop points in simulation systems such as any of simulation systems 208A–C such that the simulated state of any one of circuit parts 102A–C can be examined and analyzed. In general, including stop points in a simulation can cause deadlock of the simulation. Suppose, for example, that simulation systems 208A–C are programmed to stop execution at a particular simulation time, e.g., 500 simulated microseconds from the beginning of the simulation. If VBS 204A posts while simulation system 208B is stopped at a stop point the simulation is deadlocked since simulation system 208A cannot resume execution until VBS 204B of simulation system 208B posts and VBS 204B cannot post since execution of simulation system 208B is stopped at the stop point.

What persists in the art as an unsatisfied need is a deadlock avoidance mechanism which prevents deadlock situation in distributed bus stubs which collected simulate a bus (i) through which two or more circuit parts communicate, (ii) which is relatively simple to implement, and (iii) which is simultaneously effective and does not interfere with a test developers ability to insert stop points in any hardware simulation to thereby examine and/or analyze the simulation of a circuit part.

SUMMARY OF THE INVENTION

In accordance with the present invention, execution of a simulation system is not necessarily suspended while a virtual bus stub ("VBS") posts simulated bus signals and reaps a resolved simulated bus state. Instead, a VBS posts simulated bus signals as a single step and execution of the simulation system which includes the VBS continues. As a subsequent, separate step, the VBS substantially immediately thereafter reaps a resolved simulated bus state. Thus, the above-described deadlock situation cannot occur since, if a first and a second VBS post simultaneously, respective simulation systems containing the first and second VBSs continue to execute and the other VBSs of the respective simulation systems can then also post such that all VBSs of the first and second can reap resolved simulated bus states of multiple busses.

Synchronization in such a system is achieved by grouping into zones all VBSs which collectively represent the simulated state of a single bus. A single bus is a collection of one or more signal pathways between two or more circuit parts of a simulated circuit which are accessed according to a common clock signal. Each VBS has one of four states, namely, reap running, reap stopped, post running, post stopped. When a VBS posts, it is determined whether any other VBS of the same zone has yet to reap a previously resolved simulated bus state. If such a VBS exists, the posting VBS moves from reap running state to a post stopped state and execution of the simulation system containing the posting VBS is suspended. Otherwise, if all VBSs of the same zone have reaped the previously resolved simulated bus state, the posting VBS moves from a reap running state to a post running state and execution of the simulation system containing the posting VBS continues. When the last VBS of a zone reaps the previously resolved simulated bus state, all simulation systems which contain VBSs of the zone in a post stopped state, i.e., simulation systems whose execution is suspended, are awakened, i.e., execution of such simulation systems is resumed. In addition, each of the VBSs of the zone in the post stopped state move to the post running state.

When a VBS reaps, it is determined whether any other VBS of the same zone has yet to post simulated bus signals for the current resolution of the simulated bus state. If such a VBS exists, the reaping VBS moves from post running state to a reap stopped state and execution of the simulation system containing the reaping VBS is suspended. Otherwise, if all VBSs of the same zone have reaped simulated bus signals for the current resolution of the simulated bus state, the reaping VBS moves from a post running state to a reap running state and execution of the simulation system containing the reaping VBS continues. When the last VBS of a zone posts simulated bus signals for the current resolution of the simulated bus state, all simulation systems which contain VBSs of the zone in a reap stopped state, i.e., simulation systems whose execution is suspended, are awakened, i.e., execution of such simulation systems is resumed. In addition, each of the VBSs of the zone in the reap stopped state move to the reap running state and are updated to include the simulated state of the bus as most currently resolved.

In this way, deadlocks are avoided efficiently and effectively. In addition, a test developer can insert stop points in any simulation system without specifically adapting such break points to work in the context of the deadlock avoidance mechanism and without effecting the operation of the deadlock avoidance mechanism. Specifically, a first simulation system cannot be stopped pending posting or reaping by a VBS of a second simulation which is ahead of the first simulation system in simulation time. Execution of the a simulation system can only be suspended pending action of another simulation system which is behind the former simulation system in simulation time.

DETAILED DESCRIPTION

Figure 3:
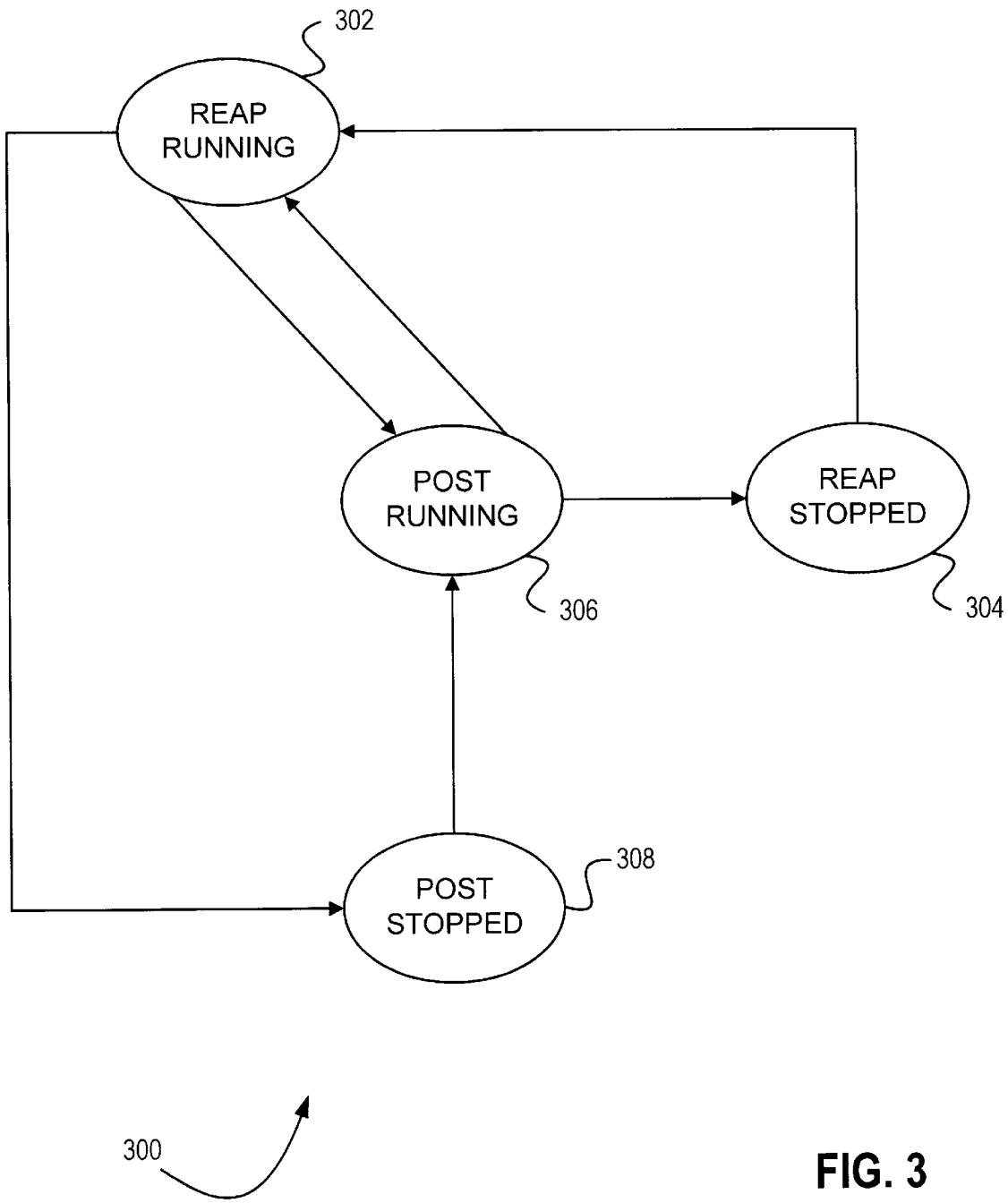
FIG. 3 is a state diagram illustrate the states and state transitions of a virtual bus stub in accordance with the present invention.

In accordance with the present invention, virtual bus stubs ("VBSs") which collectively represent a bus are grouped into a zone and post and reap simulated bus signals from a resolver according to a state model represented by state diagram 300 (FIG. 3). Posting simulated bus states, awaiting resolution of the simulated state of the bus, and reaping the simulated state are not performed in one uninterrupted sequence. Instead, a VBS of a zone posts simulated bus signals of the bus of the zone in one operation, and, in a separate operation which is performed substantially immediately thereafter, reaps resolved simulated bus signals. A bus is a collection of one or more signal pathways between two or more circuit parts of a simulated circuit, such as circuit 100 (FIG. 1) which are accessed according to a common clock signal. Each of the VBSs is in one of the four states of state diagram 300 (FIG. 3), namely, reap running state 302, reap stopped state 304, post running state 306, and post stopped state 308.

Each VBS is initially in reap running state 302. When a VBS, e.g., VBS 204A (FIG. 2), posts to a resolver, which is described more completely below and which resolves posted simulated bus signals to resolve a simulated bus state, the VBS changes from reap running state 302 to either post running state 306 or post stopped state 308. If all of the VBSs of the zone have reaped all the previously resolved simulated bus states of the bus of the zone, a posting VBS of the zone moves from reap running state 302 to post running state 308 and execution of the simulation which includes the posting VBS continues. Conversely, if another VBS of the same zone has yet to reap the previously resolved simulated bus state of the bus of the zone, a posting VBS of the zone moves from reap running state 302 to post stopped state 308 and execution of the simulation which includes the posting VBS is suspended. When the last VBS of the zone reaps the previously resolved simulated bus state of the bus of the zone, all VBSs in post stopped state 308 move to post running state 306 and execution of each simulation which includes such a VBS is resumed.

After posting, each VBS in post running state 306 reaps from the resolver the resolved simulated bus state of the bus of the zone. When a VBS, e.g., VBS 204A (FIG. 2), attempts to reap the resolved simulated bus state from the resolver, the VBS changes from post running state 306 to either reap running state 302 or reap stopped state 304. If all of the VBSs of the zone have posted simulated bus states for the current resolution of the bus of the zone, a reaping VBS of the zone moves from post running state 306 to reap running state 302 and execution of the simulation which includes the posting VBS continues. Conversely, if another VBS of the same zone has yet to post simulated bus states for the current resolution of the bus of the zone, a reaping VBS of the zone moves from post running state 306 to reap stopped state 304 and execution of the simulation which includes the reaping VBS is suspended. When the last VBS of the zone posts simulated bus states for the current resolution of the bus of the zone, all VBSs in the reap stopped state 304 move to the reap running state 302, data representing the resolved simulation state of the bus is provided to each VBS, and execution of each simulation which includes such a VBS is resumed.

As a result of this posting and reaping protocol, the deadlock situation described above cannot happen. Specifically, VBSs 204A and 206B do not belong to the same zone and execution of a simulation system during posting or attempted reaping by a particular VBS corresponding to a particular bus can only be suspended pending action by a VBS which corresponds to the same particular bus. VBSs 204A and 204B represent bus 104 which, in this example, is accessed according to a bus clock signal which is different from the bus clock signal according to which bus 106 is accessed. VBSs 204A and 204B therefore are grouped into a single zone. VBSs 206A–C represent bus 106 and are therefore grouped into another zone. Execution of simulation system 208A can only be suspended pending action by VBS 206B of simulation system 208B under either of two circumstances: (i) VBS 206A is posting simulated bus signals of bus 106 and VBS 206B has not yet reaped the previously resolved simulated bus state of bus 106, or (ii) VBS 206A is reaping a resolved simulated bus state of bus 106 and VBS 206B has not yet posted simulated bus signals for the same resolution of the simulated bus state of bus 106. Execution of simulation system 208B can only be suspended pending action by VBS 204A of simulation system 208A under either of two circumstances: (iii) VBS 204B is posting simulated bus signals of bus 104 and VBS 204A has not yet reaped the previously resolved simulated bus state of bus 104, or (iv) VBS 204B is reaping a resolved simulated bus state of bus 104 and VBS 204A has not yet posted simulated bus signals of bus 104. Deadlock between simulation systems 208A and 208B cannot occur unless a one of situations (i) and (ii) and one of situations (iii) and (iv) occur simultaneously, i.e., at the same exact simulation time.

In situation (i) described above, situation (iii) cannot occur simultaneously. In situation (i), VBS 206A is awaiting reaping of a previously resolved simulated bus state of bus 106 by VBS 206B. In simulation time, simulation by simulation system 208A is therefore ahead of simulation by simulation system 208B. Thus, VBS 204B cannot simultaneously be awaiting reaping of a previously resolved simulated bus state of bus 104 by VBS 204A, which requires that simulation by simulation system 208A is behind of simulation by simulation system 208B in simulation time. Situation (iv) similarly cannot occur simultaneously with situation (i). In situation (iv), execution of simulation system 208B is ahead of execution of simulation system 208A in simulation time since VBS 2043 is reaping a resolved simulated bus state, and has therefore posted simulated bus signals, bus 104. This is inconsistent with simulation system 208A being ahead of simulation system 208B as required by situation (i). Therefore, situation (i) and either situation (iii) or situation (iv) cannot occur simultaneously.

As described above, VBS 206A is attempting to reap a resolved simulated bus state of bus 106 and VBS 206B has not yet posted simulated bus signals for the same resolution of the simulated bus state of bus 106 in situation (ii). Such requires that execution of simulation system 208A is ahead of execution of simulation system 208B in simulation time, which is inconsistent with execution of simulation system 208A being behind execution of simulation system 208B in simulation time as required by situations (iii) and (iv) as described above. Therefore, neither situation (i) nor situation (ii) can occur simultaneously with either situation (iii) or situation (iv) and a deadlock between simulation systems 208A and 208B cannot occur. If VBSs 206A and 204B post simultaneously as described in the deadlock scenario described above, simulation systems 208A and 208B continue to execute and VBSs 206A and 204B proceed to reap simulated bus states.

Hardware Operating Environment

Figure 4:
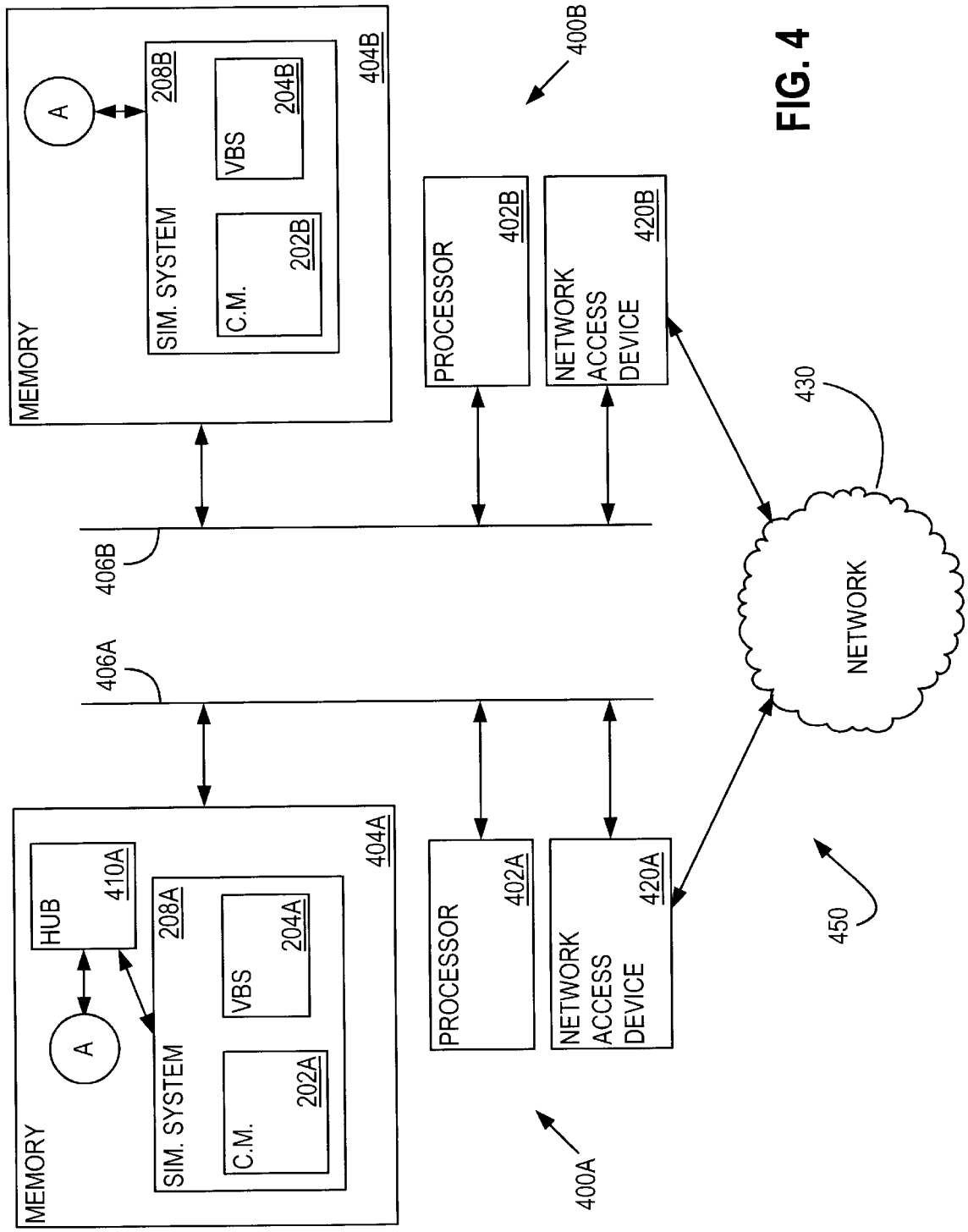
FIG. 4 is a block diagram of two computers connected through a network to form a computer network in which simulation of a circuit is distributed in accordance with the present invention.

The general nature of VBSs 206A–C and 204A–B is described in the "Virtual Bus" Application and that description is incorporated herein by reference. However, for completeness, the description is briefly repeated here. FIG. 4 shows computers 400A and 400B connected to one another through a network 430 to form a computer network 450. Each of computers 400A and 400B are directly analogous to one another, and the following description of computer 400A is equally applicable to computer 400B.

Computer 400A includes a processor 402A which fetches computer instructions from a memory 404A through a bus 406A and executes those computer instructions. In executing computer instructions fetched from memory 404A, processor 402A can retrieve data from or write data to memory 404A, display information on one or more computer display devices (not shown), receive command signals from one or more user-input devices (not shown), or transfer data to computer 400B through network 430. Processor 402A can be, for example, any of the SPARC processors available from Sun Microsystems, Inc. of Mountain View, Calif. Memory 404A can include any type of computer memory including, without limitation, randomly accessible memory (RAM), read-only memory (ROM), and storage devices which include magnetic and optical storage media such as magnetic or optical disks. Computer 400A can be, for example, any of the SPARCstation workstation computer systems available from Sun Microsystems, Inc. of Mountain View, Calif.

Computer 400A also includes a network access device 420A, through which computer 400A is coupled to network 430. Network access device 420A retrieves data from and writes data to network 430 in accordance with control signals received from processor 402A through bus 406A. Data retrieved from or written to network 430 generally includes information specifying a computer connected to network 430 as the destination and/or the source of the information. Thus, information can be transferred between a computer process executing in processor 402A from memory 404A and a computer process executing in processor 402B from memory 404B, both of computer 400B, through network 430.

For example, simulation system 208B can transfer data to hub 410A by including computer instructions which, when executed by processor 402B, cause processor 402B to transfer the data, including specification of hub 410A of computer 400A as the recipient of the data, to network access device 420B and to issue control signals to network access device 420B to send the data through network 430. Network access device 420B, in response to the control signals, sends the data to network 430, which forwards the data to computer 400A in accordance with the specification of the recipient. Network access device 420A retrieves the data from network 430 and transfers the data to processor 402A which then writes the data to hub 410A in accordance with the specification of the recipient. The transfer of data between computers 400A and 400B through network 430 is conventional and well-known.

Network access device 420A can be generally any circuitry which is used to transfer data between a computer and network such as computer 400a and network 430 and can be, for example, an Ethernet controller chip or a modem. Sun, Sun Microsystems, and the Sun Logo are trademarks or registered trademarks of Sun Microsystems, Inc. in the United States and other countries. All SPARC trademarks are used under license and are trademarks of SPARC International, Inc. in the United States and other countries. Products bearing SPARC trademarks are based upon an architecture developed by Sun Microsystems, Inc.

Figure 1:
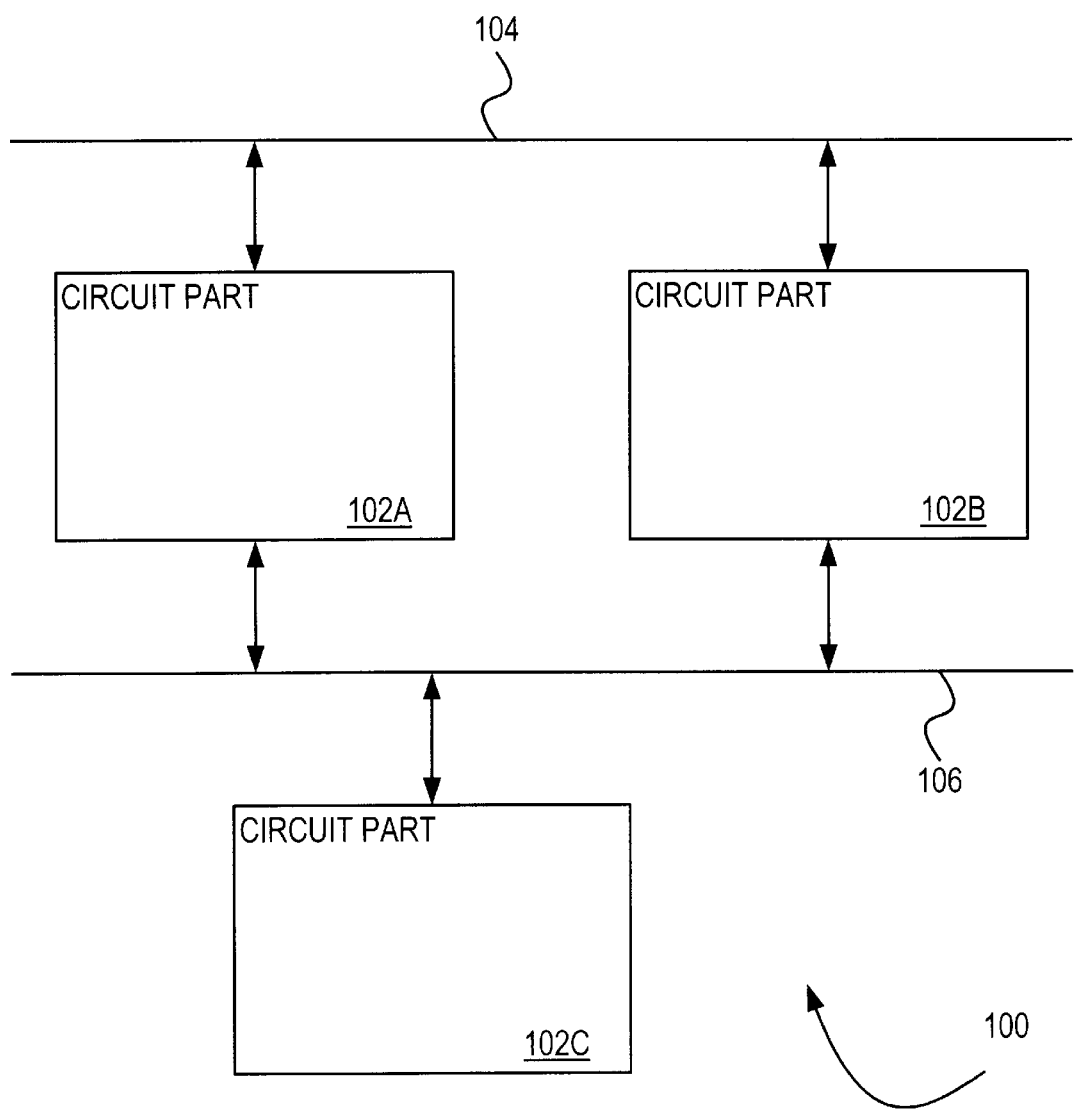
FIG. 1 is a block diagram of a circuit which includes a number of circuit parts which are coupled to another through, and communicate with one another through, a number of busses.
Figure 2:
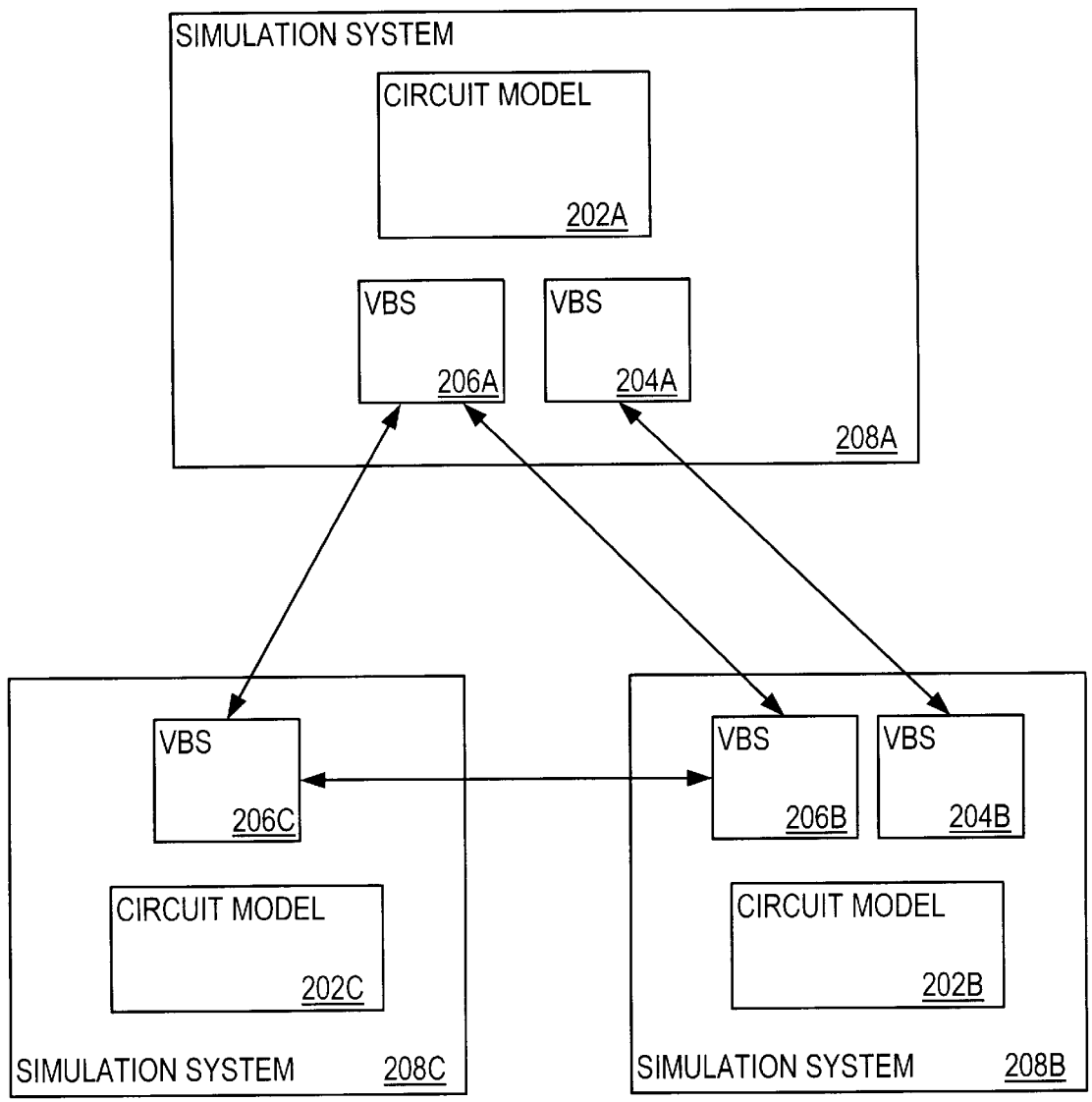
FIG. 2 is a block diagram of a number of simulation systems, each of which includes a number of circuit models and virtual bus stubs and which collectively simulate the circuit of FIG. 1.

Simulation system 208A is a computer process executing in processor 402A from memory 404A. Simulation system 208A includes a circuit model 202A (FIG. 2) of circuit part 102A (FIG. 1) and simulates circuit part 102A in accordance with circuit model 202A (FIG. 2). In simulating circuit part 102A, simulation system 208A (FIG. 2) receives test data defining simulated signals to be applied to components of circuit part 102A (FIG. 1) and produces result data which represents signals produced by circuit part 102A in response to the test data. The test data and result data collectively define a test of circuit part 102A. A simple test can include, for example, test data which represents signals to be stored in a register of circuit part 102A, data indicating that a clock signal is to be applied to circuit part 102A, and specification of resulting data which is to be retrieved from the same or other registers of circuit part 102A after application of one or more cycles of the clock signal. Simulation system 208A can be, for example, the Cadence Verilog hardware simulator available from Cadence Design Systems, Inc. of San Jose, Calif.

Circuit model 202A is generally in the form of a hardware description language ("HDL") and generally includes data defining input signals to circuit part 102A, output signals of circuit part 102A, internal signals of circuit part 102A (e.g., signals stored in registers), and inter-relationships between the input signals, output signals, and internal signals. Simulation system 208A includes circuit model 202A which, as described above, represents in HDL circuit part 102A (FIG. 1) of circuit 100. Simulation systems 208B–C (FIG. 2) are directly analogous to simulation system 208A and the foregoing description of simulation system 208A is equally applicable to simulation systems 208B–C. Simulation system 208B includes circuit model 202B which represents in HDL circuit part 102B (FIG. 1).

Simulation system 208A (FIG. 1) also includes VBSs 204A and 206A which represent the simulated state of busses 104 (FIG. 1) and 106, respectively, and which simulate within simulation system 208A (FIG. 2) the interaction of circuit part 102A (FIG. 1) with other circuit parts of circuit 100 through busses 104 and 106, respectively. Similarly, simulation system 208B (FIG. 1) includes VBSs 204B (FIG. 2) and 206B which represent the simulated state of busses 104 (FIG. 1) and 106, respectively, and which simulate within simulation system 208B (FIG. 2) the interaction of circuit part 102B (FIG. 1) with other circuit parts of circuit 100 through busses 104 and 106, respectively. In addition, simulation system 208C (FIG. 1) includes VBS 206B (FIG. 2) which represents the simulated state of bus 106 (FIG. 1) and which simulates within simulation system 208B (FIG. 2) the interaction of circuit part 102B (FIG. 1) with other circuit parts of circuit 100 through bus 106. Simulation systems 208B–C (FIG. 2), circuit models 202B–C, and VBSs 206A–C and 204B are directly analogous to simulation system 208A, circuit model 202A, and VBS 204A, respectively. Accordingly, the following description of simulation system 208A, circuit model 202A, and VBS 204A is equally applicable to simulation systems 208B–C (FIG. 2), circuit models 202B–C, and VBSs 206A–C and 204B, respectively.

Figure 5:
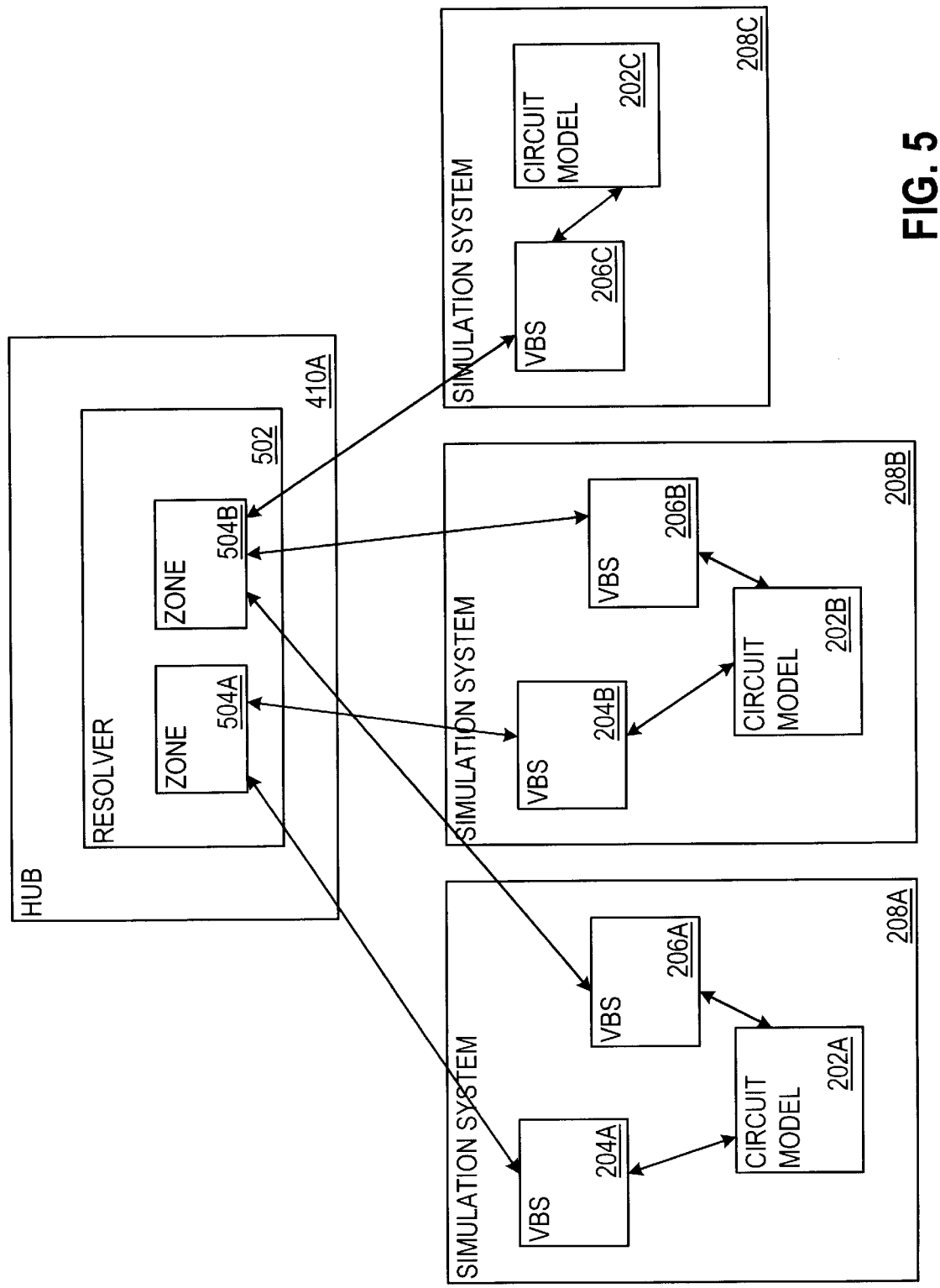
FIG. 5 is a block diagram of simulation systems and a hub which execute in the computer network of FIG. 4 to effect the distributed simulation of FIG. 1.

FIG. 5 shows simulation systems 208A–C and hub 410A of FIG. 4 in more detail. Simulation system 208A is configured such that driving a line of bus 104 (FIG. 1) by circuit part 102A is simulated by a data transfer from circuit model 202A (FIG. 5) to VBS 204A and sampling a line of bus 104 (FIG. 1) by circuit part 102A is simulated by a data transfer from VBS 204A (FIG. 5) to circuit model 202A. Hub 410A includes a resolver 502 which resolves the respective simulated states of busses 104 (FIG. 1) and 106 as simulated, respectively, by VBSs 204A–B (FIG. 5) and VBSs 206A–C. Specifically, resolver 502 includes zones 504A and 504B which resolve simulated states of busses 104 (FIG. 1) and 106, respectively. For every cycle of a simulated bus clock which controls access to bus 104 (FIG. 1), VBS 204A (FIG. 5) transfers to zone 504A of resolver 502 data indicating the state of bus 104 (FIG. 1) as represented by VBS 204A (FIG. 5). VBS 204B similarly transfers to zone 504A of resolver 502 data indicating the state of bus 104 (FIG. 1) as represented by VBS 204B (FIG. 5). Zone 504A of resolver 502 resolves the state of bus 104 (FIG. 1) from data received from VBSs 204A–B (FIG. 5) and transfers to VBSs 204A–B data representing the resolved state of bus 104 (FIG. 1). Thus, VBSs 204A–B (FIG. 5) and zone 504A of resolver 502 cooperate to accurately simulate bus 104 (FIG. 2) to thereby allow circuit models 202A (FIG. 5) and 202B to independently and accurately simulate circuit parts 102A (FIG. 1) and 102B, respectively, in the context of circuit 100. VBSs 206A–C and zone 504B of resolver 502 cooperate in a directly analogous manner to accurately simulate bus 106 (FIG. 2) to thereby allow circuit models 202A–C (FIG. 5) to independently and accurately simulate circuit parts 102A–C (FIG. 1), respectively, in the context of circuit 100. As a result, circuit parts 102A–C can be easily and effectively simulated on different constituent computers of a computer network such as computer network 450 (FIG. 4).

The transfer from a VBS, e.g., VBS 204A (FIG. 5), to resolver 502 of data representing the state of a bus is sometimes referred to herein as "posting." The transfer from resolver 502 to a VBS of data representing the resolved simulated state of a bus is sometimes referred to herein as "reaping."

Figure 6:
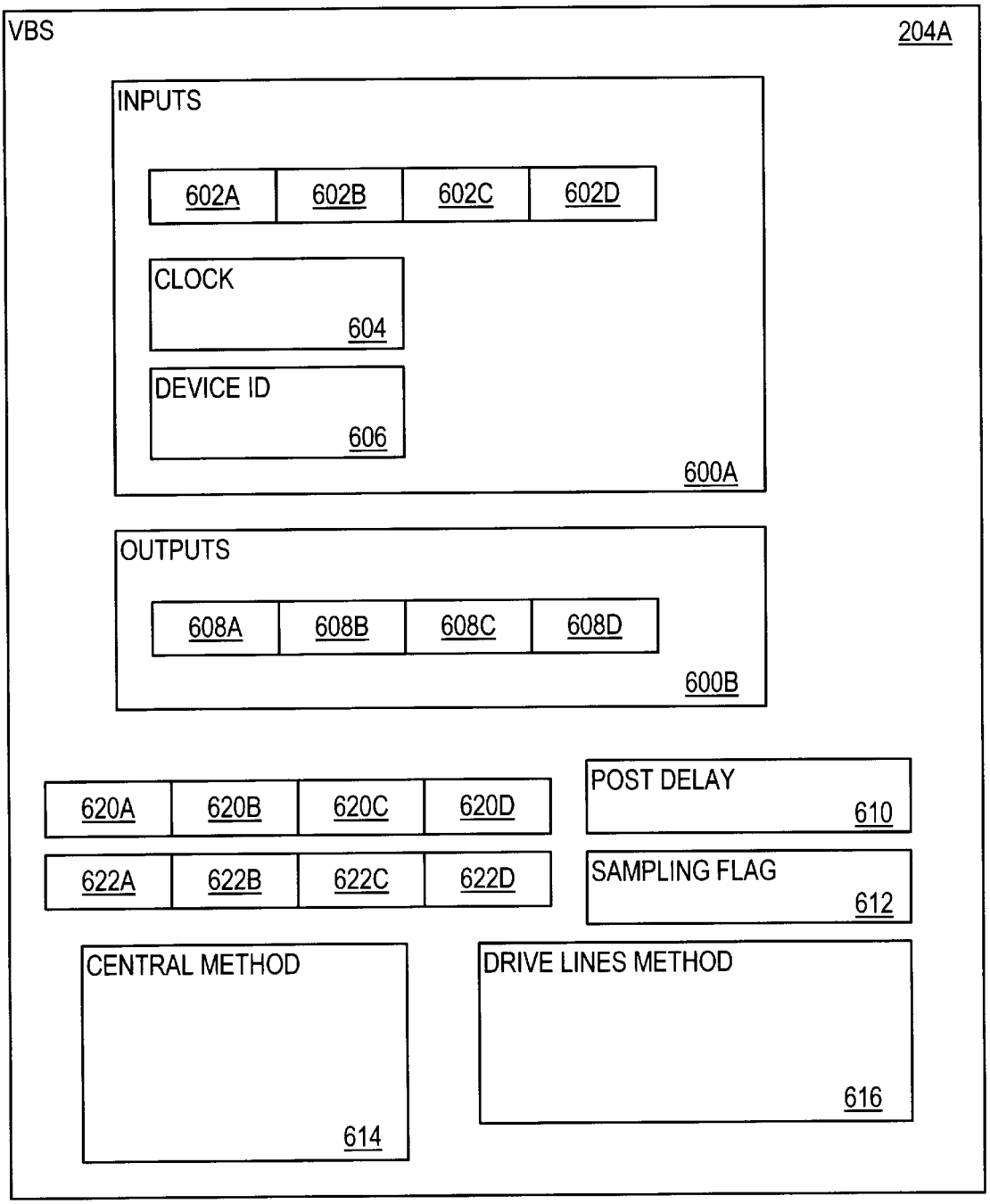
FIG. 6 is a block diagram of a virtual bus stub of FIG. 5 in greater detail.

VBS 204A is shown in greater in detail in FIG. 6. VBS 204A includes a number of input fields 600A and output fields 600B which are used to simulate input signals and output signals, respectively, of VBS 204A. As used herein, a field is a collection of data which collectively define a particular piece of information. Simulation system 208A (FIG. 5) stores in input fields 600A (FIG. 6) data representing signals received by VBS 204A. To simulate a signal received by VBS 204A, simulation system 208A (FIG. 5) stores in the appropriate field of input fields 600A (FIG. 6) data representing the received signal. For example, input fields 600A include a clock field 604 which represents a clock signal applied to VBS 204A. When the clock signal changes from a logical value of "0" to a logical value of "1," simulation system 208A (FIG. 5) stores data representing the logical value "1" in clock field 604.

Input fields 600A further include data input fields 602A–D and a device identifier field 606. Data input fields 602A–D each correspond to a line of bus 104 (FIG. 1) which can be driven by circuit model 202A (FIG. 5). Each of data input fields 602A–D stores data representing a simulated bus signal received from circuit model 202A (FIG. 5). While four such data input fields are shown in FIG. 6, it is appreciated that any number of data input fields can be included in input fields 600A to represent any number of lines of a bus such as bus 104 (FIG. 1). Device identification field 606 which uniquely identifies VBS 204A from all other devices of simulation system 208A (FIG. 5).

Output fields 600B include data output fields 608A–D, each of which corresponds to a line of bus 104 (FIG. 1). Each of data output fields 608A–D store data representing a simulated bus signal sent to circuit model 202A (FIG. 5).

VBS 204A (FIG. 6) also includes sampled input fields 620A–D and resolved output fields 622A–D. Each of sampled input fields 620A–D corresponds to a respective one of data input fields 602A–D and stores the simulated state of a respective line of bus 104 (FIG. 2) as driven by circuit model 202A (FIG. 5) at the most recent rising edge of the clock signal represented by data stored in clock field 604 (FIG. 6). Each of resolved output fields 622A–D corresponds to a respective one of data output fields 608A–D and stores the simulated state of a respective line of bus 104 (FIG. 1) as resolved by resolver 520 (FIG. 5) and as reaped by VBS 204A (FIG. 6). While four such data output fields are shown in FIG. 6, it is appreciated that any number of data output fields can be included in output fields 600B to represent any number of lines of a bus such as bus 104 (FIG. 1).

In addition, VBS 204A (FIG. 6) includes a post delay field 610 and sampling flag 612. A flag is a field which includes data indicating one of two possible states, e.g., true or false. Post delay field 610 and sampling flag 612 are described in greater detail below. VBS 204A further includes a central method 614 and a drive lines method 616, each of which is a collection of data and computer instructions which define the behavior of VBS 204A in simulating bus 104 (FIG. 1). Central method 614 (FIG. 6) defines the overall behavior simulated by VBS 204A, and, as described more completely below, drive lines method 616 defines a portion of the behavior simulated by VBS 204A. In simulating circuitry represented by VBS 204A, simulation system 208A (FIG. 4) retrieves computer instructions of central method 614 (FIG. 6) or drive lines method 616 and issues computer instructions to processor 402A (FIG. 4) to effect the behavior defined by VBS 204A.

Processing according to central method 614 (FIG. 6) is represented by logic flow diagram 700 (FIG. 7), in which processing begins in step 702. In step 702, VBS 204A (FIG. 6) creates mailboxes for communication with resolver 502 (FIG. 5). Mailboxes are described in the Interface Application and that description is incorporated herein by reference. Briefly, mailboxes are data structures through which data are transferred between a simulation system, e.g., simulation system 208A (FIG. 5), and hub 410A in a manner described more completely in the Interface Application. Processing transfers to step 704 (FIG. 7) in which VBS 204A (FIG. 5) registers with resolver 502. VBS 204A registers with resolver 502 by sending to resolver 502 a registration message identifying VBS 204A and the zone to which VBS 204A belongs. In designing and implementing VBSs 204A–C and 206A–B, a test design engineer assigns each VBS to a zone and each VBS stores data specifying to which zone the VBS belongs. As described more completely below, resolver 502 must generally determine that all VBSs which collectively simulate a single bus have posted or that all VBSs which collectively simulate a bus have reaped during a particular resolution of the simulated state of the bus. By registering with resolver 502, VBS 204A ensures that resolver 502 will consider VBS 204A in making such determinations. Processing transfers from step 704 (FIG. 7) to step 706, in which VBS 204A (FIG. 6) initializes sampling flag 612 to store data indicating that VBS 204A is not currently sampling the simulated bus signals driven by circuit model 202A.

Processing transfers to loop step 708 (FIG. 7) which, in conjunction with next step 724, defines a loop of steps 710–722 which are executed as each rising edge of the simulated clock signal of VBS 204A (FIG. 6), i.e., the simulated signal stored in clock field 604. For each rising edge of the simulated clock signal, processing transfers from loop step 708 (FIG. 7) to step 710.

Figure 8:
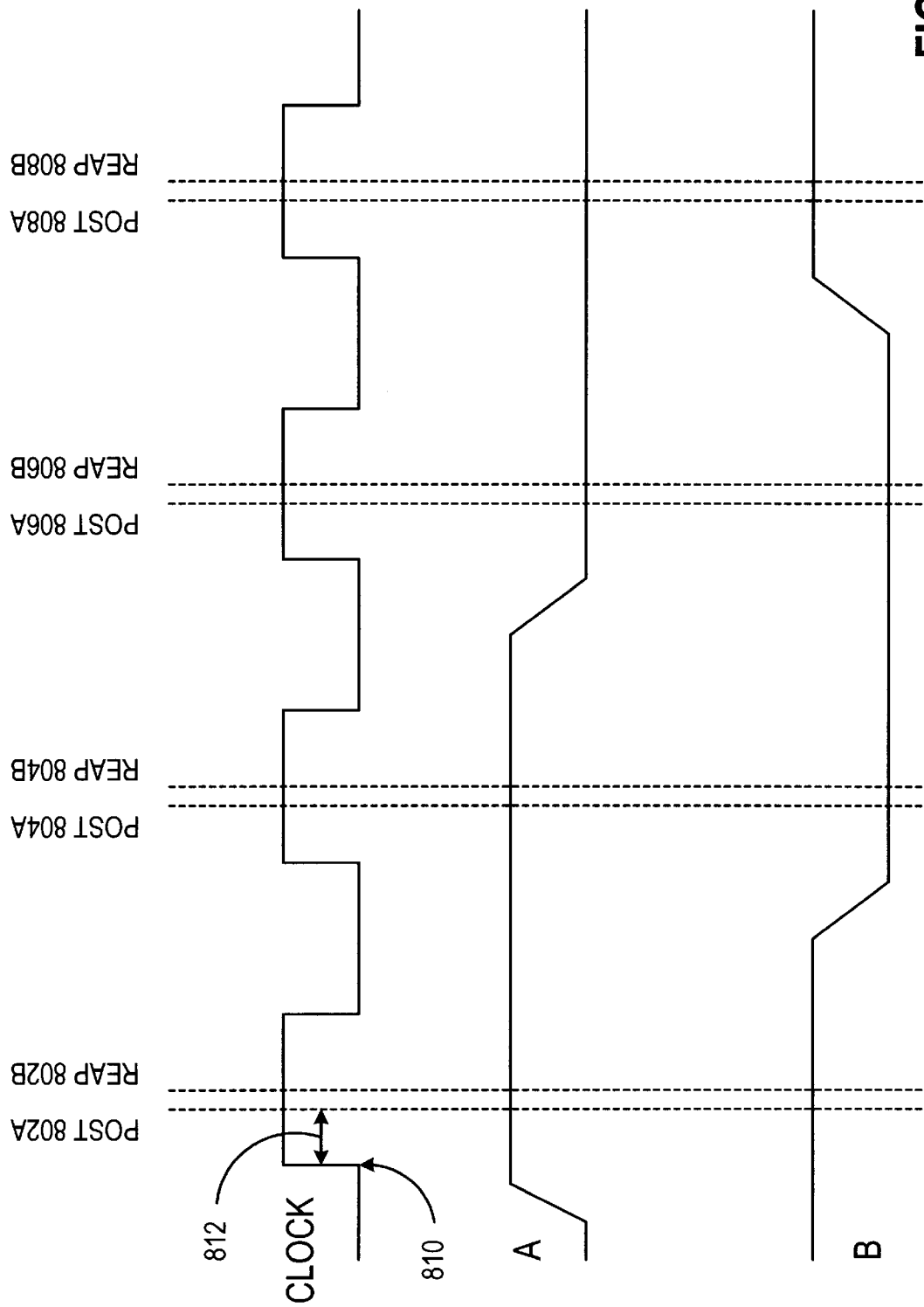
FIG. 8 is a timing diagram illustrating the timing in simulation time of resolution of a virtual bus state.

In step 710, VBS 204A (FIG. 6) delays for a period of simulated time indicated by data stored in post delay field 610. Simulated time is kept by simulation system 208A (FIG. 5) and represents time elapsing during operation of the circuit simulated by simulation system 208A. FIG. 8 shows simulated signals A, B, and CLOCK of bus 104 (FIG. 1). After a delay 812 (FIG. 8) after rising edge 810 of simulated clock signal CLOCK, i.e., at post time 802A, posting by VBS 204A (FIG. 6) is initiated. Shortly thereafter, as described more completely below, reaping by VBS 204A is initiated at reap time 804A (FIG. 8). By delaying a period of time from the rising edge of the clock signal represented by clock field 604 (FIG. 6), the state of bus 104 (FIG. 1) is resolved at a simulated time at which bus 104 should have a steady state.

Figure 7:
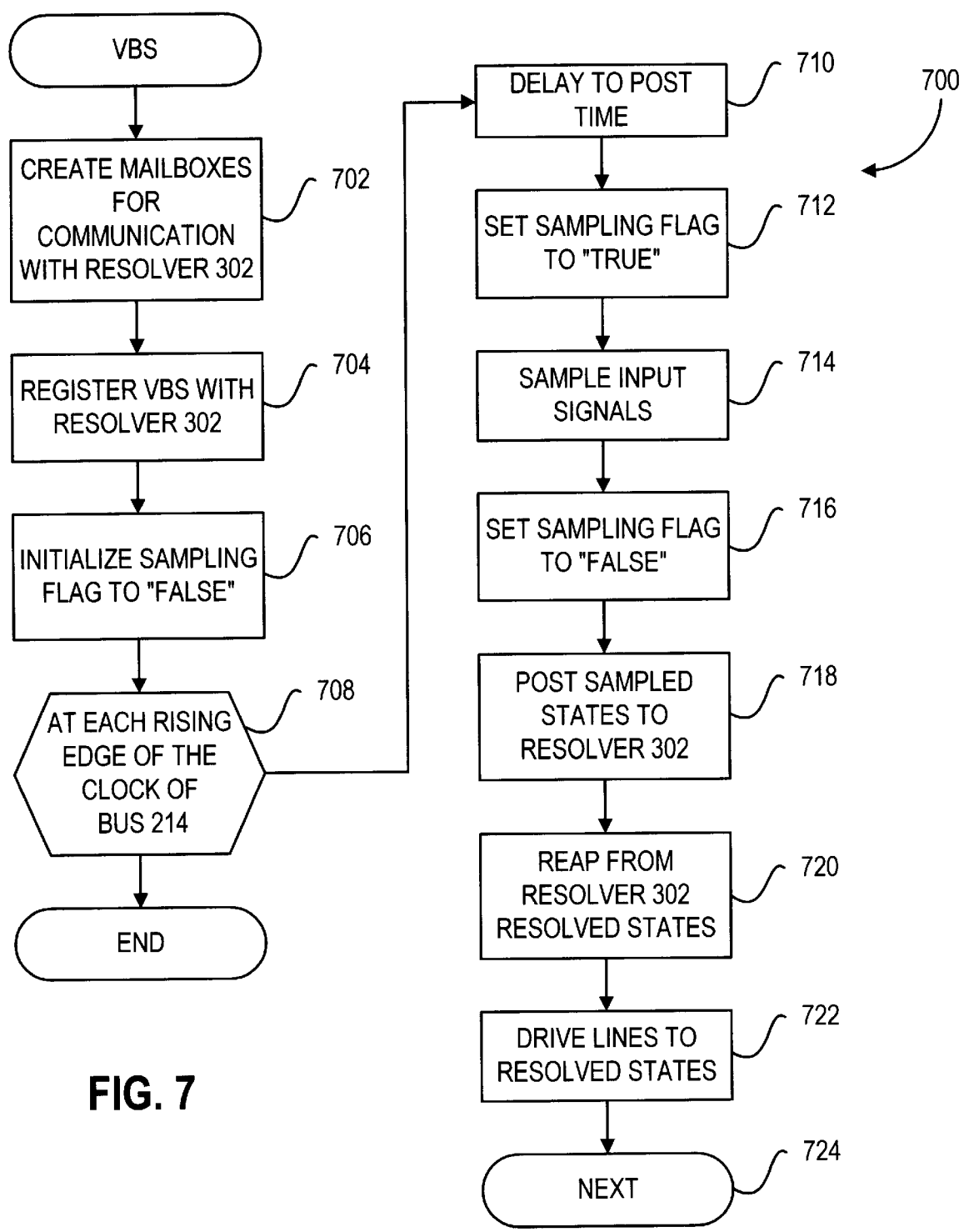
FIG. 7 is a logic flow diagram representing the processing of the virtual bus stub of FIG. 6.

From step 710 (FIG. 7), processing transfers to step 712 in which VBS 204A (FIG. 6) sets sampling flag 616 to indicate that VBS 204A is currently sampling the simulated bus signals driven by circuit model 202A. As described more completely below, setting sampling flag 616 to indicate that VBS 204A is currently sampling the simulated bus signals driven by circuit model 202A causes data stored in data output fields 608A–D to represent a high impedance state whereby circuit model 202A perceives all lines of bus 104 (FIG. 1) to be in a high impedance state to prevent VBS 204A from affecting or influencing the signals driven by circuit model 202A and sampled by VBS 204A. Processing transfers to step 714 (FIG. 7).

In step 714, VBS 204A (FIG. 5) samples the simulated input signals received from circuit model 202A. Specifically, VBS 204A (FIG. 6) moves data from data input fields 602A–D into sampled input fields 620A–D, respectively. Processing transfers from step 714 (FIG. 7) to step 716.

In step 716, VBS 204A (FIG. 6) sets sampling flag 612 to indicate that VBS 204A is not currently sampling the simulated bus signals driven by circuit model 202A. In step 718 (FIG. 7), to which processing transfers from step 716, VBS 204A (FIG. 6) posts the simulated signals of lines of bus 104 (FIG. 1) as represented in sampled input fields 620A–D (FIG. 6) by sending to resolver 520 (FIG. 5) data representing the simulated signals as represented in sampled input fields 620A–D (FIG. 6). Processing transfers from step 718 (FIG. 7) to step 720.

As described more completely below, resolver 520 (FIG. 5) can cause suspension of execution of simulation system 208A during the resolution of the simulated state of bus 104 (FIG. 1) and can cause resumption of execution of simulation system 208A (FIG. 5) when the resolution is complete. When such execute resumes, processing according to logic flow diagram 700 (FIG. 7) resumes at the point at which processing is suspended. For example, if execution of simulation system 208A is suspended when VBS 204A is carrying out step 718 (FIG. 7), processing by VBS 204A (FIG. 5) transfers to step 720 (FIG. 7) when execution of simulation system 208A (FIG. 5) resumes. Similarly, if execution of simulation system 208A is suspended when VBS 204A is carrying out step 720 (FIG. 7), processing by VBS 204A (FIG. 5) transfers to step 722 (FIG. 7) when execution of simulation system 208A (FIG. 5) resumes.

Figure 9:
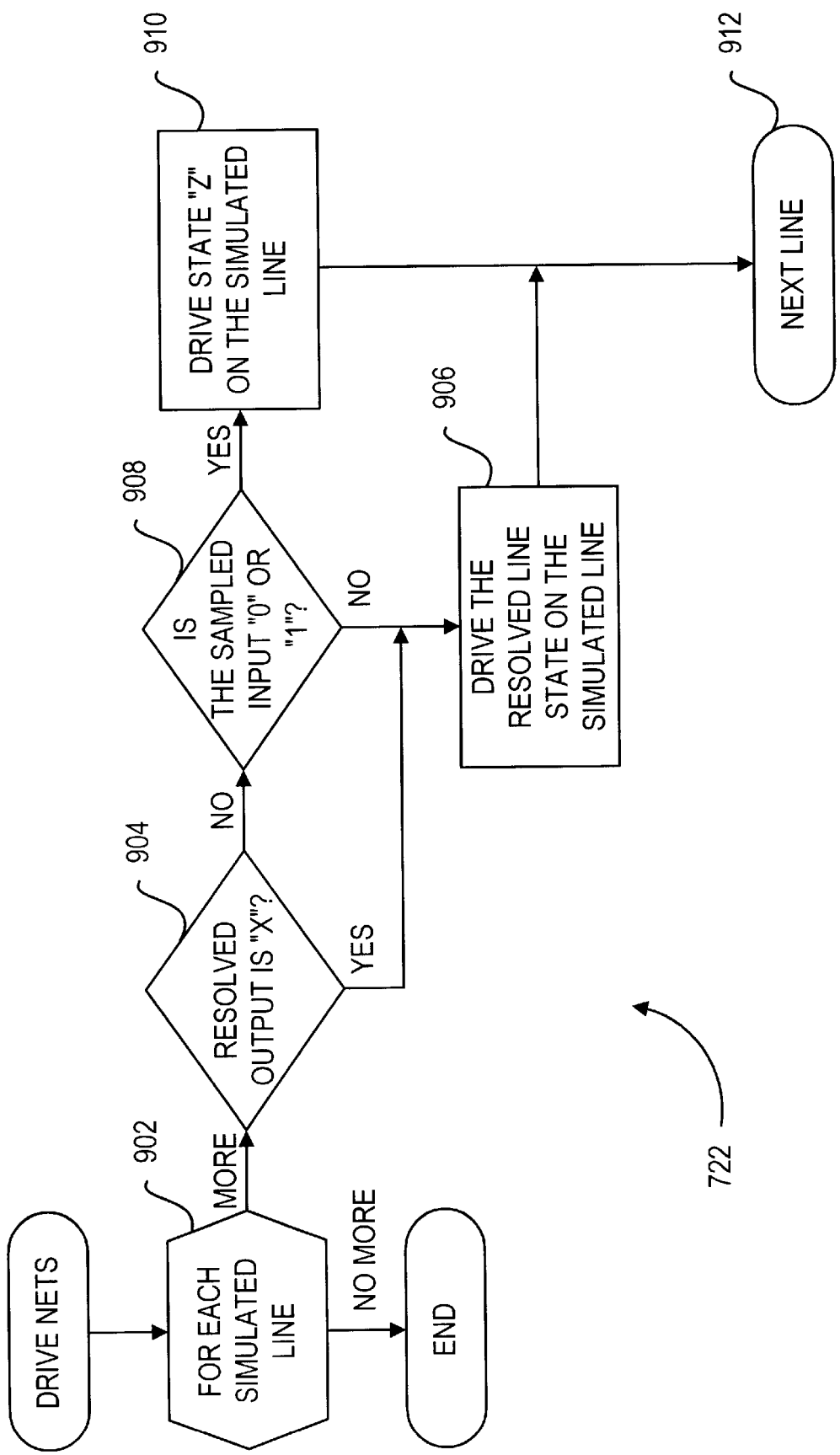
FIG. 9 is a logic flow diagram representing more completely the processing of a step of the logic flow diagram of FIG. 7.

In step 720 (FIG. 7), VBS 204A (FIG. 6) reaps from resolver 520 (FIG. 5) data representing the simulated state of bus 104 (FIG. 1) as resolved by resolver 520 (FIG. 5) and stores the data in resolved output fields 622A–D (FIG. 6). Step 720 (FIG. 7) is performed at a simulation time which follows the simulation time at which the simulated signals are posted in step 718. The difference in simulation time between steps 718 and 720 is usually quite small and is represented in FIG. 8 by a small space between post time 702A and reap time 704A. By allowing a small amount of simulation time to elapse between steps 718 and 720, hub 410A is given an opportunity to change the state of bus 104 (FIG. 1) prior to reaping of the resolved bus signals by VBS 204A (FIG. 5) in step 720 (FIG. 7). Processing transfers from step 720 to step 722 in which VBS 204A (FIG. 6) drives simulated output signals represented by data output fields 608A–D according to the simulated states represented in resolved output fields 622A–D, respectively. Processing according to step 722 (FIG. 7) is defined by drive lines method 616 (FIG. 6) and is shown in greater detail as logic flow diagram 722 (FIG. 9).

Drive lines method 616 (FIG. 6) specifies the behavior of VBS 204A in driving lines of bus 104 (FIG. 1) and is specific to the particular type of bus represented by VBS 204A, i.e., to the particular bus protocol of bus 104 (FIG. 1). Therefore, logic flow diagram 722 (FIG. 9) is merely an illustrative example of a method by which VBS 204A (FIG. 5) can drive a bus line.

Processing according to logic flow diagram 722 (FIG. 9) begins in loop step 902 which, in conjunction with next step 912, defines a loop in which each of the lines of bus 104 (FIG. 1) simulated by VBS 204A (FIG. 5) is processed. During each iteration of the loop defined by loop step 902 (FIG. 9) and next step 912, the simulated line processed is referred to as the subject simulated line. For each simulated line, processing transfers from loop step 902 to decision step 904.

In decision step 904, VBS 204A (FIG. 5) compares the resolved signal of the subject simulated line to a logical "X" which, as described below, represents an unknown or invalid state. If the resolved signal of the subject simulated line is not a logical "X", processing transfers from decision step 904 to decision step 908 which is described below. Conversely, if the resolved signal of the subject simulated line is a logical "X", processing transfers from decision step 904 to step 906.

In step 906 (FIG. 9), VBS 204A (FIG. 5) transfers to circuit model 202A (FIG. 5) the signal received from resolver 502 which corresponds to the subject simulated line. Specifically, VBS 204A copies data from the one of resolved output fields 622A–D (FIG. 6) corresponding to the subject simulated line, which is referred to as the subject resolved output field in the context of logic flow diagram 722 (FIG. 9), and stores the copied data in the one of data output fields 608A–D (FIG. 6) corresponding to the subject simulated line in the context of logic flow diagram 722 (FIG. 9), the one of data output fields 608A–D (FIG. 6) corresponding to the subject simulated line is referred to as the subject data output field. As described above, data stored in the subject data output field represents the simulated state of the subject simulated line from the perspective of circuit models 202A–B (FIG. 5). By copying data from the subject resolved output field to the subject data output field, VBS 204A (FIG. 5) drives on the subject simulated line the resolved signal of the subject simulated line. Processing transfers from step 906 (FIG. 9) through next step 912 to loop step 902 in which the next simulated line of bus 104 (FIG. 1) is processed according to the loop defined by loop step 902 and next step 912.

In decision step 908, to which processing transfers from decision step 904 if the resolved signal of the subject simulated line is not a logical "X", VBS 204A (FIG. 5) determines whether circuit model 202A is driving the subject simulated line by comparing the simulated signal represented in the one of sampled input fields 620A–D (FIG. 6) which corresponds to the subject simulated line and which is referred to as the subject sampled input field in the context of logic flow diagram 722 (FIG. 9) to logical values of "1" and "0." If circuit model 202A is not driving the subject simulated line, the subject sampled input field stores data representing a simulated signal having a logical value of "Z" and processing transfers from decision step 904 (FIG. 9) to step 906 which is described above. Conversely, if circuit model 202A (FIG. 5) is driving the subject simulated line, the subject sampled input field stores data representing a simulated signal having a logical value of either "1" or "0" and processing transfers from decision step 908 (FIG. 9) to step 910. Logical values "Z" and "X" are described in greater detail below.

In step 910, VBS 204A (FIG. 5) drives a logical "Z" on the subject simulated line to prevent VBS 204A from effect or influencing the simulated signal driven on the subject simulated line by circuit model 202A. Processing transfer from step 910 (FIG. 9) through next step 912 loop step 902 in which the next simulated line of bus 104 (FIG. 1) is processed according to the loop defined by loop step 902 (FIG. 9) and next step 912. Once each of the simulated lines of bus 104 (FIG. 1) is processed according to the loop defined by loop step 902 (FIG. 9) and next step 912, processing according to logic flow diagram 722, and therefore step 722 (FIG. 7) completes.

From step 722, processing transfers through next step 724 to loop step 708 from which processing transfers to step 710 at the next rising edge of the simulated signal represented in clock field 604 (FIG. 6) of VBS 204A. Thus, for circuit model 202A (FIG. 5), VBS 204A simulates a bus to which circuit model 202A is connected and through which circuit model 202A is connected to other simulated circuit parts, e.g., circuit model 202B. VBS 204A receives from circuit model 202A data which represent states to be driven on simulated lines of bus 104 (FIG. 1) and sends to circuit model 202A (FIG. 5) data which represents the resulting states of the simulated lines of bus 104 (FIG. 1).

Circuit model 202A transfers data to and from VBS 204A in precisely the same manner circuit model 202A would transfer data to and from circuit models 202B–C (FIG. 2) and other simulated circuit parts as if circuit models 202B–C and the other circuit models were processed by simulation system 208A. As a result, circuit models 202A–C require no adaptation to be distributed among difference simulation systems, e.g., simulation systems 208A–C. In addition, VBSs 204A–B and 206A–C cooperate to simulate the cumulative behavior of all circuitry coupled to busses 104 (FIG. 1) and 106 in a manner which is independent of the particular behavior of such circuitry. For example, VBS 204A simulates for simulation system 208A the behavior of circuit 202B (FIG. 2) with respect to simulating access to bus 104 (FIG. 2) by circuit part 102B without any adaptation which is specific to the design of circuit model 202B. Thus, to distribute circuit models 202A–C among different simulation systems which can execute on different constituent computers of a computer network, a design verification engineer need only construct, without regard for the particular design of the various circuit models, a VBS for each circuit model for each bus through which the circuit models communicate.

Figure 10:
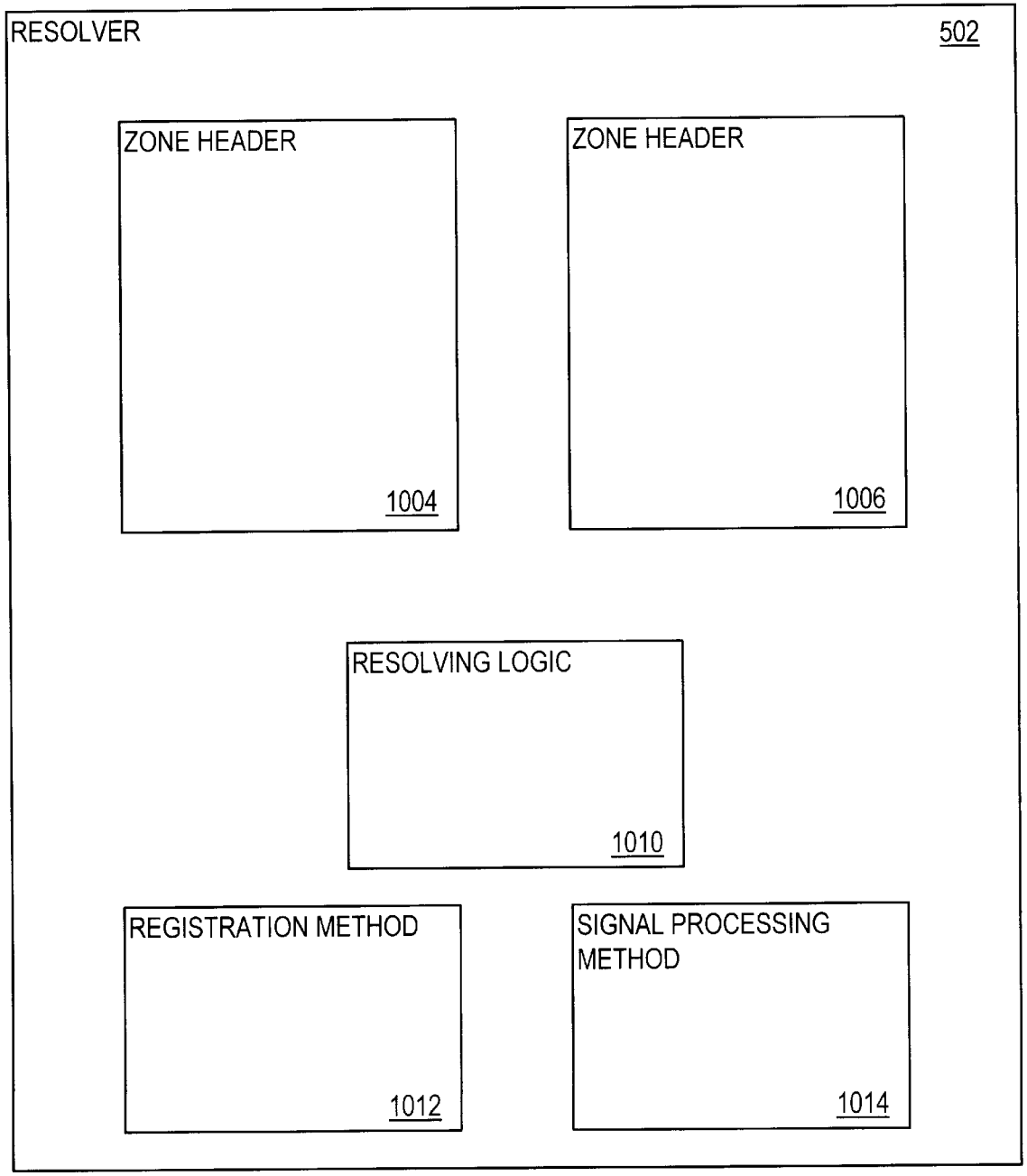
FIG. 10 is a block diagram of the resolver of FIG. 5.

Resolver 502 (FIG. 5) is shown in greater detail in FIG. 10. Resolver 502 includes a number of fields and methods used to resolve simulated lines of bus 104 (FIG. 1) in a manner described more completely below. Specifically, resolver 502 includes (i) zone headers 1004 and 1006, (ii) resolving logic 1010, (iii) a registration method 1012, and (iv) a signal processing method 1014. Each of zone headers 1004 and 1006 includes a number of fields which represent a respective zone corresponding to a bus whose simulated state is resolved by resolver 502. For example, zone header 1004 represents a zone whose members include VBSs 204A–B, and zone header 1006 represents a zone whose members include VBSs 206A–C. Zone header 1006 is directly analogous to zone header 1004; therefore, the following description of zone header 1004 is equally applicable to zone header 1006.

Figure 11:
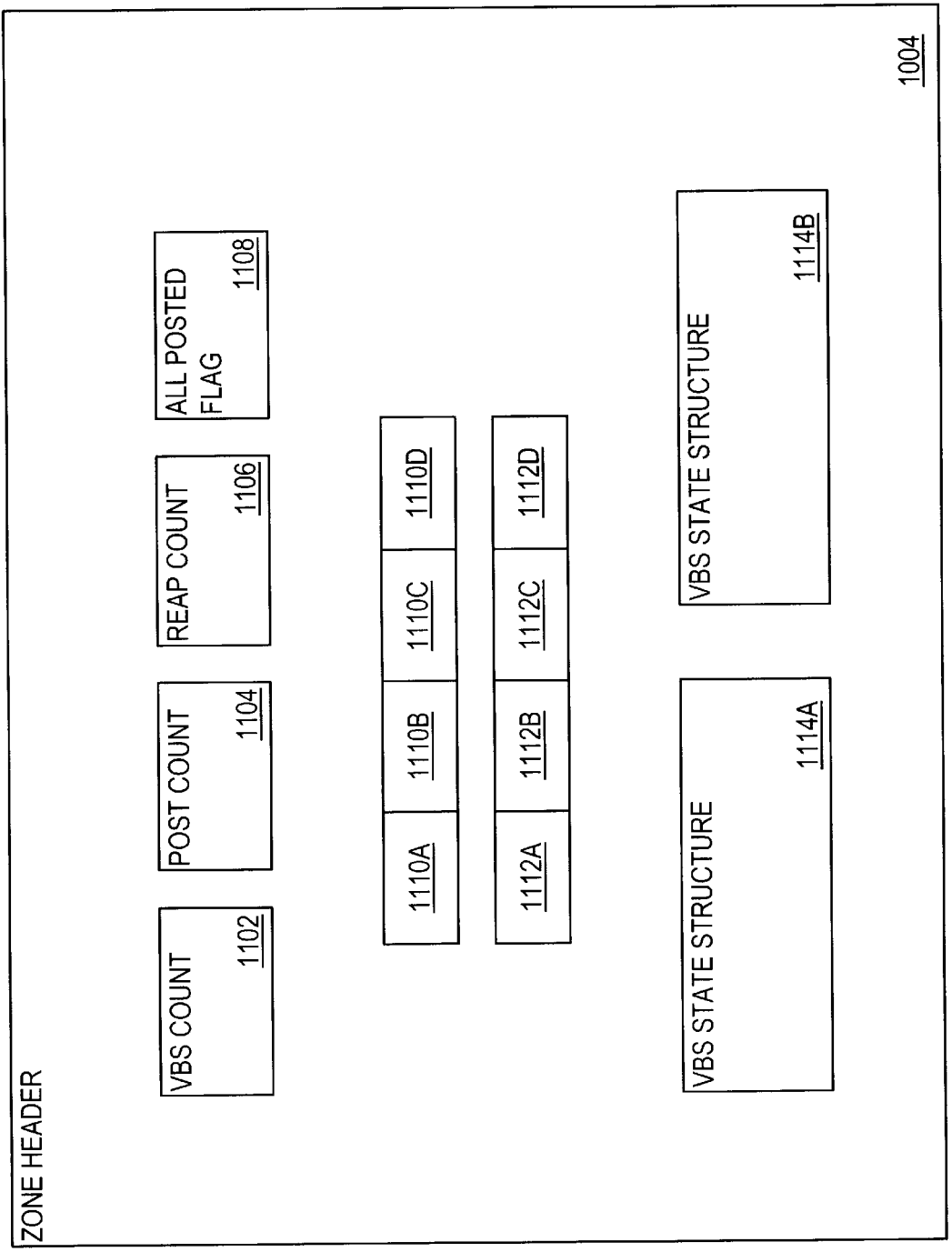
FIG. 11 is a block diagram of a zone header of the resolver of FIG. 10.

Zone header 1004 is shown in greater detail in FIG. 11 and includes (i) a VBS count field 1102, (ii) a post count field 1104, (iii) a reap count field 1106, (iv) an all posted flag 1108, (v) current resolve buffer fields 1110A–D, (vi) next resolve buffer fields 1112A–D, and (vii) VBS state structures 1114A and 1114B. Each of the components of resolver 502 (FIG. 10) and of zone headers such as zone header 1004 (FIG. 11) is described more completely below in the context of the resolution of the simulated state of bus 104 (FIG. 1).

Registration method 1012 (FIG. 10) is a collection of data fields and computer instructions which define the steps performed by processor 402A (FIG. 4) in registering each of VBSs 204A–B and 206A–C with resolver 502 (FIG. 5) of hub 410A. As described above, each of VBSs 204A–B and 206A–C send signals to resolver 502 to post and reap simulated bus signals. Signal processing method 1014 (FIG. 10) is a collection of data fields and computer instructions which define the steps performed by processor 402A (FIG. 4) in processing such signals received from VBSs 204A–B and 206A–C by resolver 502 (FIG. 5).

Figure 12:
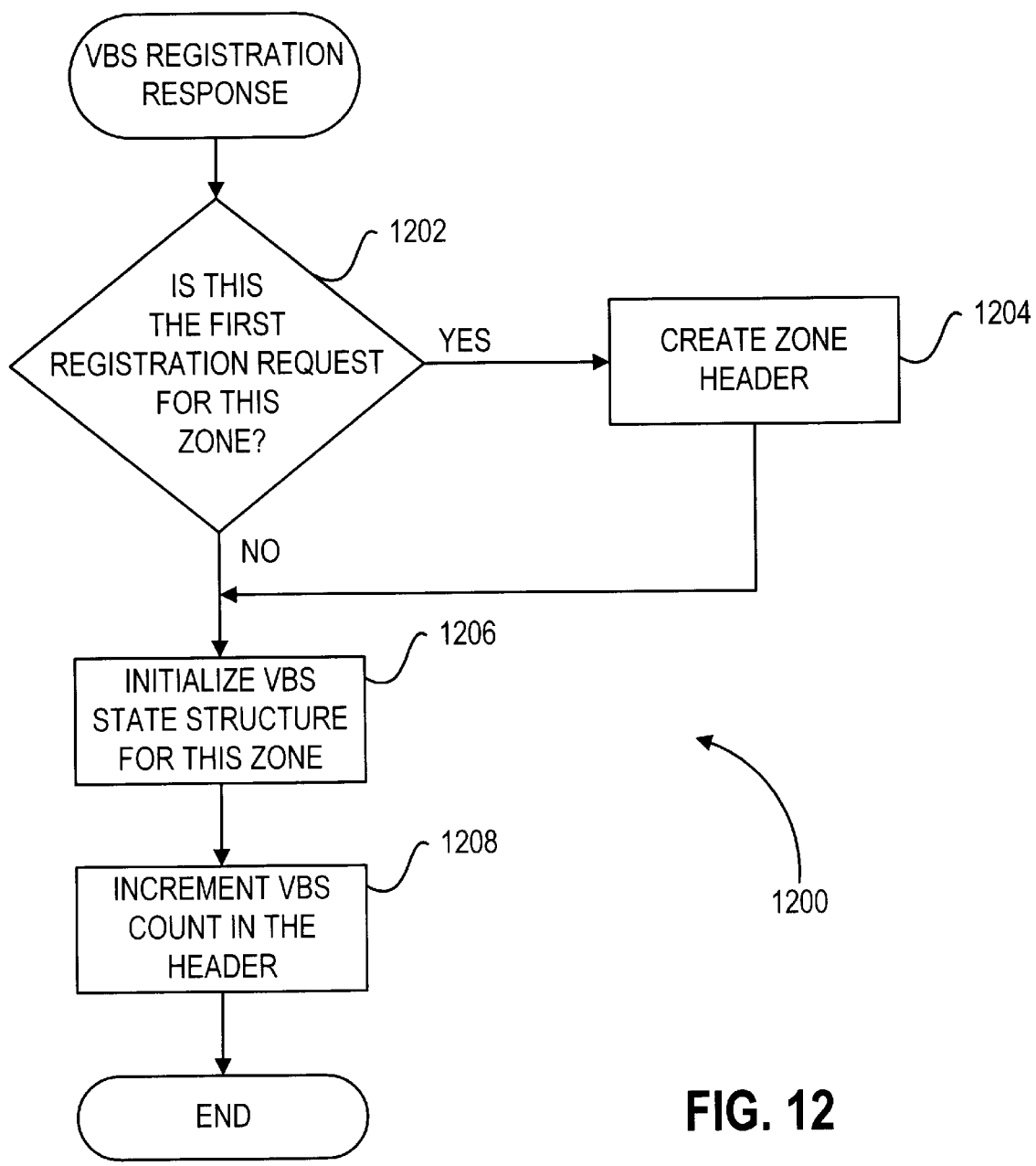
FIG. 12 is a logic flow diagram of the registration of a virtual bus stub in the hub of FIG. 5.

As described above with respect to step 704 (FIG. 7), VBS 204A (FIG. 5) registers with resolver 502. In response to registration signals received from VBS 204A, resolver 502 performs registration method 1012 (FIG. 10), processing according to which is shown as logic flow diagram 1200 (FIG. 12). Processing according to logic flow diagram 1200 begins in decision step 1202.

In decision step 1202, resolver 502 (FIG. 10) determines whether the received registration signals are the first registration signals received by resolver 502 by determining whether a zone header has been allocated from memory 404 for the particular zone for which the signaling VBS is registering. As described above, each VBS stores data specifying to which zone the VBS belongs. Furthermore, a registration message includes data which specifies to which zone the VBS belongs. Registration messages are described more completely in the Interface Application and that description is incorporated herein by reference. If a zone header has been allocated from memory 404 (FIG. 4), another VBS has already registered for the same zone with resolver 502 and processing transfers from decision step 1202 to step 1206 which is described more completely below. Conversely, if no such zone header has been allocated, no other VBSs have registered for the same zone with resolver 502 and processing transfers from decision step 1202 to step 1204.

In step 1204, resolver 502 (FIG. 10) initializes a zone header for the zone for which the signally VBS is registering. Specifically, resolver 502 allocates space within memory 404 (FIG. 4) to store a zone header, e.g., zone header 1004, and initializes the above-described fields of zone header 1004 by storing in each field data representing an initial state. The following description of logic flow diagram 1200 (FIG. 12), is presented in the context of the illustrative example of VBS 204A registering for the zone represented by zone header 1004. VBS count field 1102 (FIG. 11) contains data representing the total number of VBSs which collectively simulate bus 104 (FIG. 1) and, in step 1204 (FIG. 12), data having a value of zero is stored in VBS count field 1102 (FIG. 11) to indicate no VBSs have previously registered for zone header 1004 with resolver 502 (FIG. 10). In addition, post count field 1104 (FIG. 11) contains data representing the number of VBSs which have posted simulated bus signals during the current resolution of the simulated state of bus 104 (FIG. 1), and, in step 1204 (FIG. 12), data having a value of zero is stored in post count field 1104 (FIG. 11) to indicate no VBSs have previously posted simulated bus signals for the zone of zone header 1004 to resolver 502 (FIG. 10). Similarly, reap count field 1106 (FIG. 11), which contains data representing the number of VBSs which have reaped simulated bus signals resulting from the most recently completed resolution of the simulated state of bus 104 (FIG. 1), is initialized to contain data whose value is zero. Furthermore, all posted flag 1108 (FIG. 11), which contains data which indicates whether all VBSs which simulate bus 104 (FIG. 1) have posted simulated state data during the current resolution of the simulated state of bus 104, is initialed to contain data representing a value of "false." Processing transfers from step 1204 (FIG. 12) to step 1206.

Figure 13:
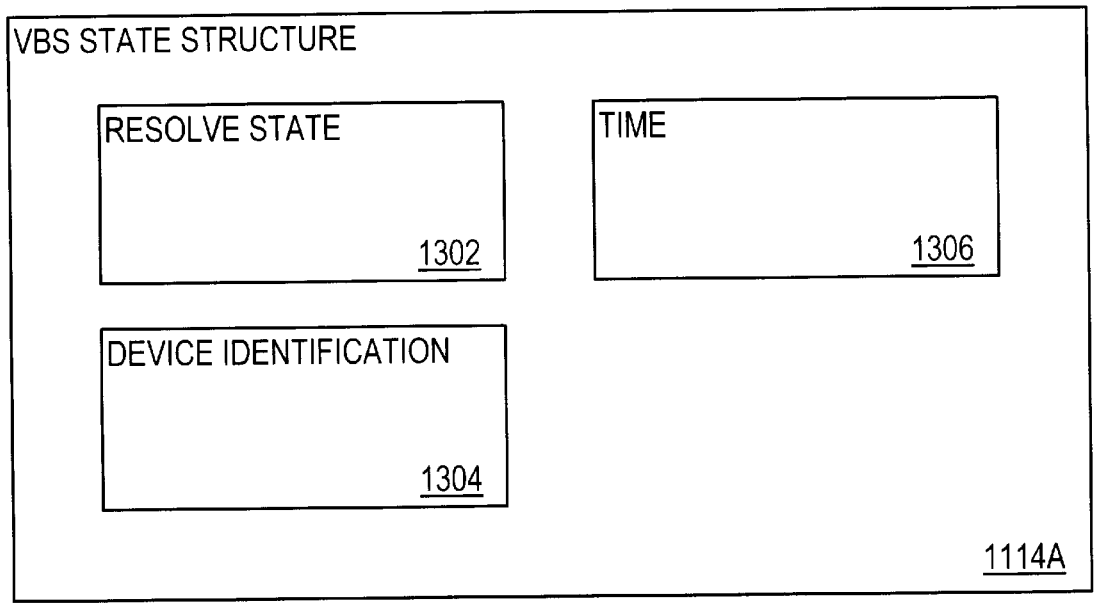
FIG. 13 is a block diagram of a VBS state structure of the resolver of FIG. 10.

In step 1206 (FIG. 12), resolver 502 (FIG. 10) initializes a VBS state structure, e.g., VBS state structure 1114A (FIG. 11), within zone header 1004 to represent the registering VBS, e.g., VBS 204A (FIG. 5). VBS state structure 1114A is shown in greater detail in FIG. 13 and includes a resolve state field 130 and a device identification field 1304. Resolver 502 (FIG. 10) initializes resolve state field 1302 (FIG. 13) by storing in resolve state field 1302 data indicating that VBS 204A is in reap running state 302 (FIG. 3). Resolver 502 (FIG. 10) initializes device identification field 1304 (FIG. 13) by storing in device identification field 1304 device identification data received from the registering VBS and embedded in the registration signals received by resolver 502 (FIG. 10). Processing transfers to step 1208 (FIG. 12) in which resolver 502 (FIG. 10) increments the value of the data stored in VBS count field 1102 (FIG. 11) to reflect the addition of the registering VBS, e.g., VBS 204A (FIG. 5), to the zone or zone header 1004, i.e., to the number of VBSs which must post prior to final resolution of the simulated state of bus 104 (FIG. 1). After step 1208 (FIG. 12), processing according to logic flow diagram 1200 completes. Thus, through registration of each of the VBSs which collectively simulate a simulated bus, e.g., bus 104 (FIG. 1), resolver 502 (FIG. 10) can maintain information regarding the state of each of the VBSs and can determine the state of the resolution of the simulated state of bus 104 (FIG. 1) as needed to ensure proper simulation of the simulated bus by each of the registered VBSs.

Figure 14:
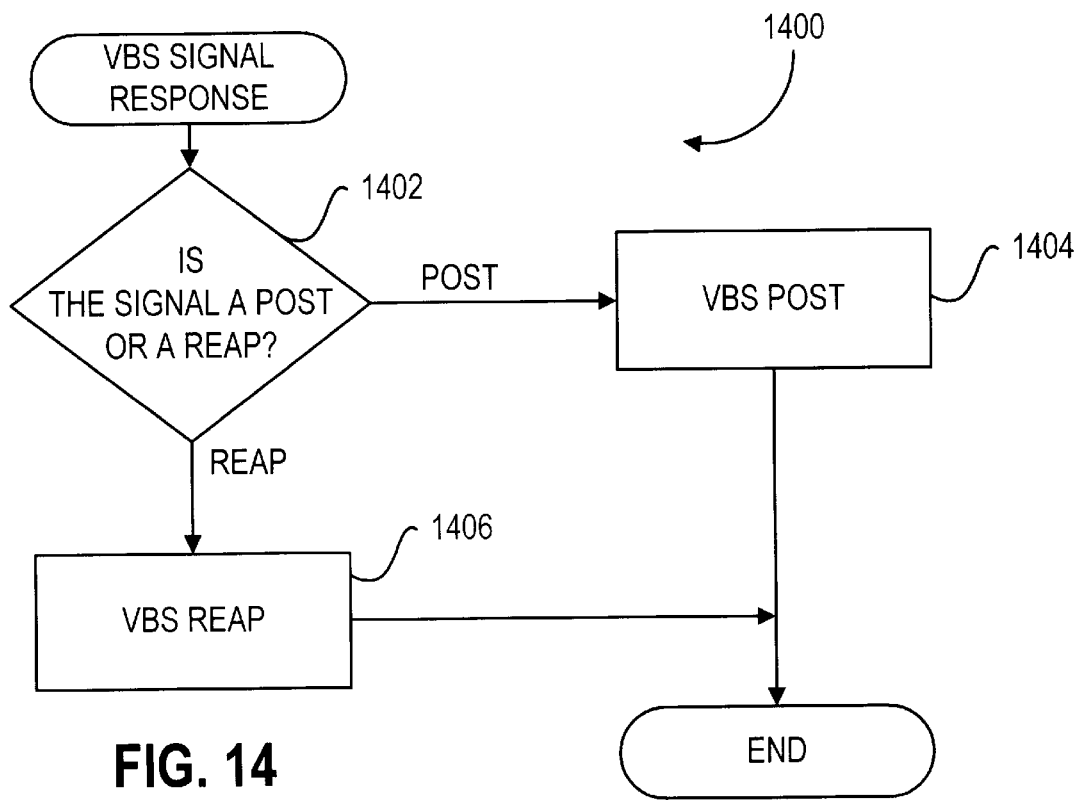
FIG. 14 is a logic flow diagram representing the processing of the hub of FIG. 5 in response to a signal received from a virtual bus stub.

As described above, VBS 204A (FIG. 5) posts simulated bus signals to, and reaps simulated bus signals from, resolver 502 by signaling resolver 502. When resolver 502 receives signals from VBS 204A, resolver 502 performs signal processing method 1016 (FIG. 10) whose performance is illustrated as logic flow diagram 1400 (FIG. 14). Processing according to logic flow diagram 1400 begins in decision step 1402.

In decision step 1402, resolver 502 (FIG. 5) determines whether the signal message received from a VBS, e.g., VBS 204A, represents posting or reaping by the signaling VBS. In one embodiment, resolver 502 makes such a determination by determining whether the received signal message contains data representing simulated bus states of bus 104 (FIG. 1). If the received signal message represents a reap request, processing transfers from decision step 1402 to step 1406 which is described in greater detail below. Conversely, if the received signal message is a post request, processing transfers from decision step 1402 to step 1404. Step 1404 is shown in greater detail as logic flow diagram 1404 (FIG. 15) in which processing begins in step 1502.

Figure 15:
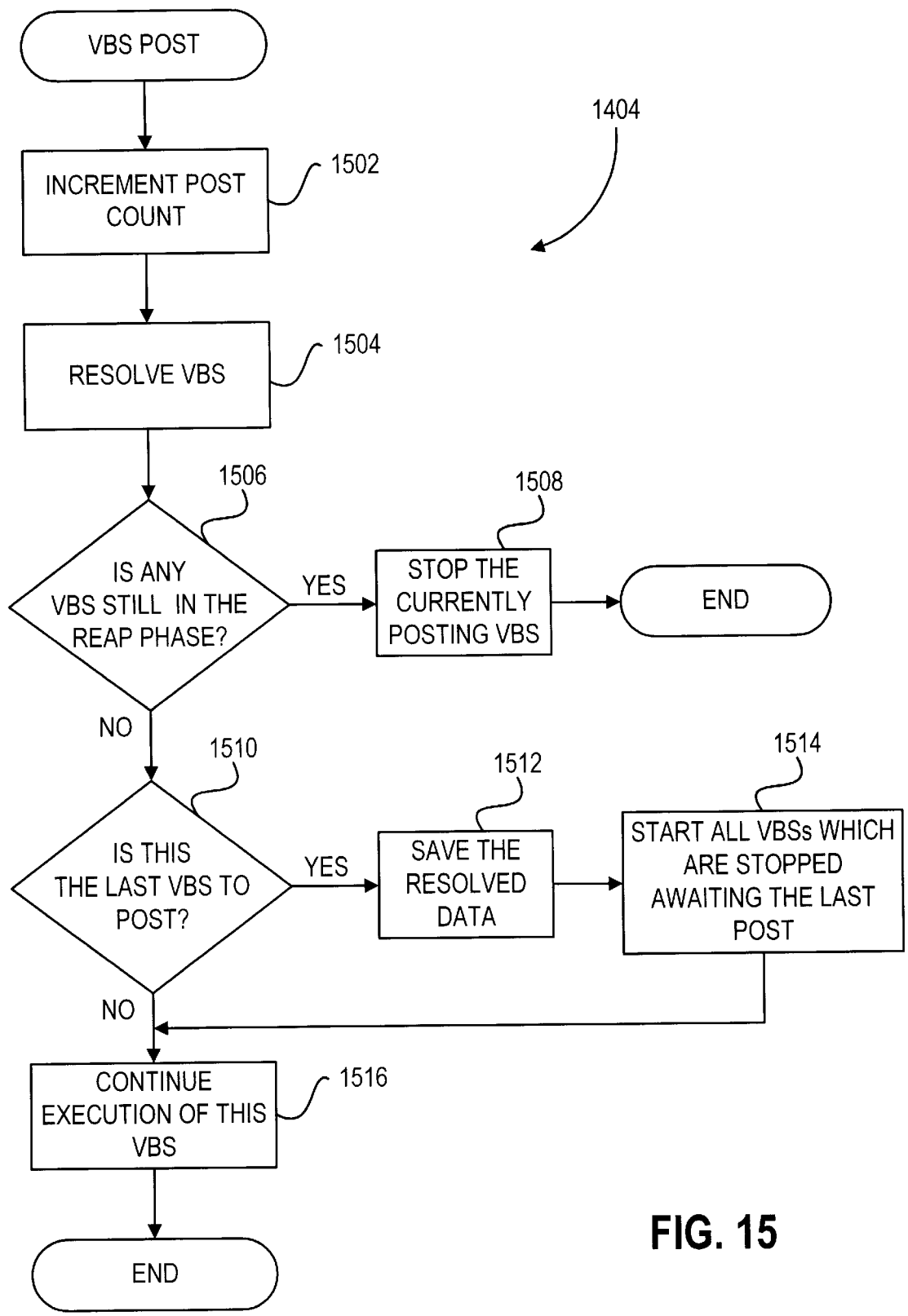
FIG. 15 is a logic flow diagram representing the processing of the hub of FIG. 5 in response to a post signal received from a virtual bus stub.
Figure 16:
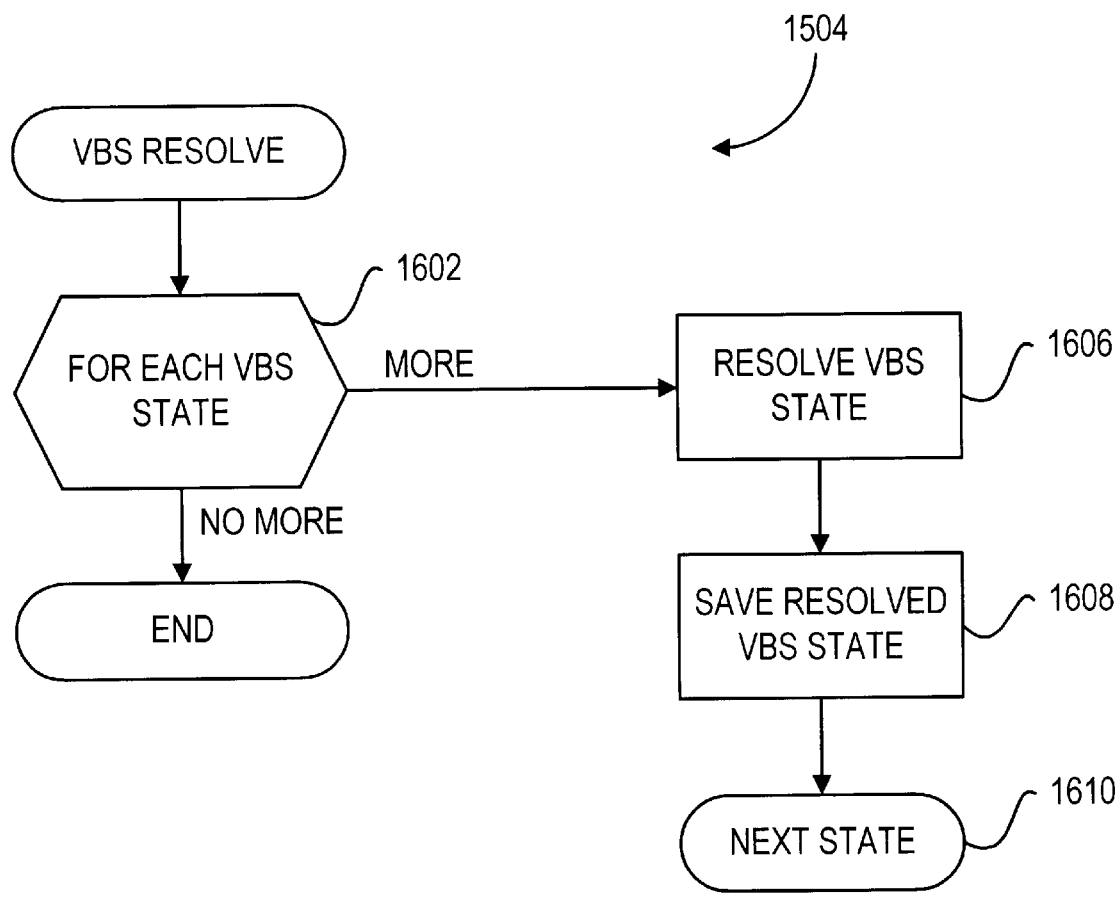
FIG. 16 is a logic flow diagram representing the processing of the hub of FIG. 5 in resolving a virtual bus state according to post signals received from virtual bus stubs.

In step 1502, resolver 502 (FIG. 10) increments the number, as represented in post count field 1104 (FIG. 11), of VBSs of the current zone which have posted during the current simulated cycle of the simulated bus. In the context of the description of logic flow diagram 1400 (FIG. 14), the current zone is the zone of zone header 1004. From step 1502 (FIG. 15), processing transfers to step 1504 in which resolver 502 (FIG. 10) resolves the posted data with the current resolved state of the simulated bus. Step 1504 is shown in greater detail as logic flow diagram 1504 (FIG. 16).

Processing according to logic flow diagram 1504 begins with loop step 1602 which, in conjunction with next step 1608, defines a loop in which each simulated signal of a line bus 104 (FIG. 1) is processed according to steps 1604 (FIG. 16) and 1606. In the context of logic flow diagram 1504, the "subject simulated signal" refers to the particular simulated signal of the posted data processed during a particular iteration of the loop defined by loop step 1602 and next step 1608. Also in the context of logic flow diagram 1504, the "subject next resolve buffer field" refers to the one of next resolve buffer fields 1108A–D (FIG. 11) which corresponds to the subject simulated signal. For each simulated signal of the posted data, processing transfers from loop step 1602 (FIG. 16) to step 1604.

In step 1604, resolver 502 (FIG. 10) resolves the subject simulated signal with previously posted simulated signals corresponding to the line of bus 104 (FIG. 1) which also corresponds to the subject simulated signal. The subject next resolve buffer field represents the simulated state of the line according to simulated states previous posted in the current simulated cycle of bus 104 (FIG. 1). Resolution by resolver 502 (FIG. 10) of the newly posted subject simulated signal with the subject next resolve buffer field is performed by resolve logic 1010, which is shown in greater detail in FIG. 17.

In this illustrative embodiment, each of the lines of bus 104 (FIG. 1) can have one of four states: (i) a logical "0", (ii) a logical "1", (iii) a high impedance state represented as a logical "Z", and (iv) an invalid or unknown state which can result from a bus collision, for example, and which is represented as a logical "X." It is appreciated that other logical values can be represented and processed in a generally analogous manner. In resolve logic 1010 (FIG. 17), registers 1702, 1704, and 1706 represent, respectively, the subject simulated signal, the subject next resolve buffer field, and the result of resolving the subject simulated signal with the subject next resolve buffer field. The representation of each of the four states in registers 1702, 1704, and 1706 is shown in Table A below.

TABLE A

| Logical Value | 1702B | 1702A | 1704B | 1704A | 1706B | 1706A |
|---|---|---|---|---|---|---|
| 0 | 0 | 0 | 0 | 0 | 0 | 0 |
| 1 | 0 | 1 | 0 | 1 | 0 | 1 |
| Z | 1 | 0 | 1 | 0 | 1 | 0 |
| X | 1 | 1 | 1 | 1 | 1 | 1 |

Figure 17:
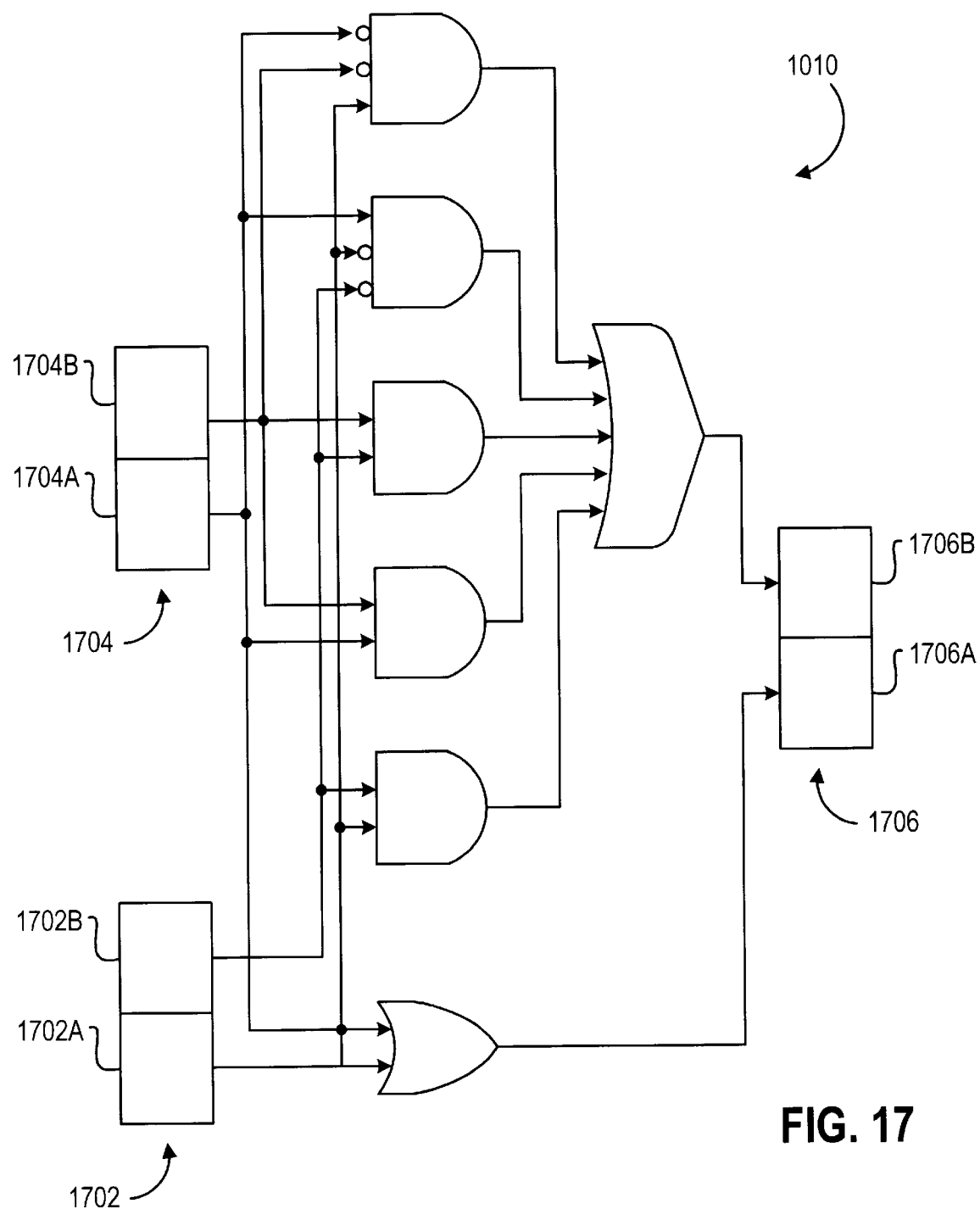
FIG. 17 is a block diagram of resolve logic of the hub of FIG. 5 in resolving the virtual bus state.

Table B below shows the resolution of the subject simulated signal with the subject next resolved buffer field according to resolve logic 1010 (FIG. 17).

TABLE B

| Register 1702 | Register 1704 | Register 1706 |
|---|---|---|
| 0 | 0 | 0 |
| 0 | 1 | X |
| 0 | Z | 0 |
| 0 | X | X |
| 1 | 0 | X |
| 1 | 1 | 1 |
| 1 | Z | 1 |
| 1 | X | X |
| Z | 0 | 0 |
| Z | 1 | 1 |
| Z | Z | Z |
| Z | X | X |
| X | 0 | X |
| X | 1 | X |
| X | Z | X |
| X | X | X |

As shown in Table B, the state of simulated next resolve buffer field as represented in register 1704 is stored in register 1706 by resolve logic 1010 (FIG. 17) if the subject simulated signal as represented in register 1702 is in a high impedance state, i.e., logical "Z." Thus, if Circuit model 202A (FIG. 5) does not drive the subject simulated signal, the state of the corresponding line of bus 104 (FIG. 1) remains unchanged. Conversely, if the subject next resolve buffer field as represented in register 1704 (FIG. 17) is in a high impedance state, resolve logic 1010 stores in register 1706 the state of the subject simulated signal as represented in register 1702. As described more completely below, each of next resolve buffer fields 1112A–D (FIG. 11) is initialized to represent a logical value of "Z" prior to each resolution of the simulated state of bus 104 (FIG. 1). Thus, if Circuit model 202A (FIG. 5) is the first simulated device to drive the subject simulated signal during the current resolution of the simulated state of bus 104 (FIG. 1), the state of the corresponding line of bus 104 is changed to the state driven by Circuit model 202A (FIG. 5).

If either the subject simulated state or the subject next resolve buffer field is in an unknown or invalid state, i.e., has a logical value of "X," resolve logic stores the logical value "X" in register 1706 (FIG. 17) to reflect the unknown or invalid state. If both the subject simulated signal and the subject next resolve buffer field are a logical "0" or both are a logical "1," resolve logic 1010 FIG. 17) stores in register 1706 the shared logical value of the subject simulated signal and the subject next resolve buffer field. Thus, for example, if two simulated circuits, e.g., Circuit models 202A and 202B (FIG. 5) both drive a single line of bus 104 (FIG. 1) to the same state, e.g., to a logical "1", then the state of the line of bus 104 is that same state. If the subject simulated state is a logical "0" and the subject next resolve buffer field is a logical "1" or if the subject simulated state is a logical "1" and the subject next resolve buffer field is a logical "0," a bus collision is detected and resolve logic 1010 (FIG. 17) stores in register 1706 a logical value of "X." Since the subject next resolve buffer field reflects the resolved state of a particular line of bus 104 (FIG. 1) according to previously posted state data, the subject next resolve buffer field can only have a logical value of "0" or "1" if another VBS previously posted a simulated signal having such a logical value. If another VBS subsequently posts a logically inconsistent, simulated signal for the same line of bus 104, a bus collision is detected and reflected in register 1706 (FIG. 17) by resolve logic 1010.

Processing transfers from step 1604 (FIG. 16) to step 1606 in which the newly resolved state stored in register 1706 (FIG. 17) is stored in the subject next resolve buffer field, replacing the state previously represented in the subject next resolve buffer field. From step 1606 (FIG. 16), processing transfers through next step 1608 to loop step 1602 in which the next of the simulated signals of the posted data according to steps 1604 and 1606. Once each of the simulated signals of the posted data is processed according to the loop defined by loop step 1602 and next step 1608, processing according to logic flow diagram 1504, and therefore step 1504 (FIG. 15) completes.

Once the data posted by VBS 204A (FIG. 5) is resolved according to step 1504 (FIG. 15), processing transfers to decision step 1506 in which resolver 502 (FIG. 10) determines if any other VBS is still reaping data from a previously resolved simulated state of bus 104 (FIG. 1). Resolver 502 (FIG. 10) makes such a determination by comparing the value of data stored in reap count field 1104 (FIG. 11) to a value of zero.

As described more completely below, reap count field 1104 stores data representing the number of VBSs of the current zone, e.g., the zone of zone header 1004, which have reaped data representing the most recently completed resolution of the simulated state of bus 104 (FIG. 1). Once all VBSs have reaped data representing the most recently completed resolution of the simulated state of bus 104, data whose value is zero is stored in reap count field 1104 (FIG. 11) to thereby reset reap count field 1104. If any VBS has not yet reaped data representing the most recently completed resolution of the simulated state of bus 104 (FIG. 1), processing transfers from decision step 1506 (FIG. 15) to step 1508.

In step 1508, resolver 502 (FIG. 10) signals the currently posting VBS, e.g., VBS 204A (FIG. 5), to cause execution of the posting VBS to be suspended. Resolver 502 (FIG. 10) also stores data representing a state of post stopped in resolve state field 1302 (FIG. 13) of the VBS state structure corresponding to the posting VBS to indicate that the posting VBS has been stopped while posting. If the posting VBS were allowed to continue executing, the posting VBS might reap data prior to completion of the current resolution and the simulated state of bus 104 (FIG. 1) represented by data so reaped might therefore reflect a prior resolved simulated state of bus 104 (FIG. 1) and therefore inaccurately simulate circuit 100. As described above, simulated bus signals posted by a VBS are resolved with previously posted simulated bus signals in step 1504 (FIG. 15) prior to suspending execution of the posting VBS in step 1508. Thus, processing according to logic flow diagram 1404 for the stopped VBS completes when execution of the stopped VBS resumes. Processing according to logic flow diagram 1404, and therefore step 1404 (FIG. 14), completes after step 1508 (FIG. 15).

If resolver 502 (FIG. 10) determines in decision step 1506 that no other VBS has yet to reap data representing the most recently completed resolution of the simulated state of bus 104 decision step 1510, resolver 502 (FIG. 10) determines whether the currently posting VBS is the last VBS to post for the current resolution of the simulated state of bus 104 (FIG. 1), i.e., the bus corresponding to zone header 1004 (FIG. 10). Resolver 502 makes such a determination by comparing the value stored in VBS count field 1102 (FIG. 11) of zone header 1004 to the value stored in post count field 1104. If the compared values are equal, the currently posting VBS is the last VBS to post data for the current resolution of the simulated state of bus 104 (FIG. 1) and processing transfers from decision step 1510 (FIG. 15) to step 1512. Conversely, if the compared values are not equal, other VBSs have yet to post data for the current resolution of the simulated state of bus 104 (FIG. 2) and processing transfers from decision step 1510 (FIG. 15) to step 1516, which is described more completely below.

In step 1512, the resolved simulated state of bus 104 (FIG. 1) is saved. Specifically, resolver 502 (FIG. 10) copies data representing the respective resolved states of each of the lines of bus 104 (FIG. 1) from next resolve buffer fields 1112A–D (FIG. 11) to current resolve buffer fields 1110A–D, respectively. Once the simulated states have been copied from next resolve buffer fields 1112A–D to current resolve buffer fields 1110A–D, the resolved simulated state as stored in current resolve buffer fields 1110A–D are available for reaping by VBSs such as VBSs 204A (FIG. 5) and 204B. Resolver 502 initializes each of next resolve buffer fields 1112A–D (FIG. 11) such that each of next resolve buffer fields 1112A–D contains data representing a logical value of "Z" to reflect that no simulated signal having a logical value of "0" or "1" has yet been posted in the next resolution of the simulated state of bus 104 (FIG. 1). Processing transfers from step 1512 (FIG. 15) to step 1514 in which resolver 502 (FIG. 10) signals each of the VBSs whose execution is stopped as a result of a previous performance of step 1804 (FIG. 18) as described below to resume execution. Resolver 502 (FIG. 10) determines which VBSs are so stopped by comparing resolve state field 1302 (FIG. 13) of each VBS state structure, e.g., VBS state structures 1114A and 1114B (FIG. 11), of the current zone, i.e., the zone of zone header 1004, to data representing reap stopped state 304 (FIG. 3). Resolver 502 stores in the signal message, through which execution of each VBS in reap stopped state 304 (FIG. 3) is resumed, data representing resolved simulated bus signals which are thus reaped by the VBS. Resolver 502 stores in the resolve state field of each VBS state structure, e.g., resolve state field 1302 (FIG. 13) of VBS state structure 1114A, corresponding to a VBS so stopped data representing a reap running state to reflect that execution of the VBS is resumed.

In step 1516 (FIG. 15), to which processing transfers from decision step 1510 and from step 1514, resolver 502 (FIG. 10) sets the state of the currently posting VBS to post running and signals the currently posting VBS to continue execution. For example, if the currently posting VBS corresponds to VBS state structure 1114A (FIG. 11), resolver 502 (FIG. 10) stores in resolve state field 1302 (FIG. 13) of VBS state structure 1114A data representing a post running state. From step 1516 (FIG. 15), processing according to logic flow diagram 1404, and therefore step 1404 (FIG. 14), completes. Thus, resolver 502 (FIG. 5) receives posted data representing driven signals by each VBS of a zone and resolves from the driven signals received from each VBS the simulated state of a simulated bus, such as bus 104 (FIG. 1), which corresponds to the zone, e.g., the zone of zone header 1004 (FIG. 10).

Reaping the Simulated State

As described above, in processing a signal from a VBS, e.g., VBS 204A (FIG. 5), processing by resolver 502 transfers to step 1406 (FIG. 14) if resolver 502 determines that the signal represents a reap request from the VBS. Step 1406 is shown in greater detail as logic flow diagram 1406 (FIG. 18) in which processing begins in decision step 1802.

In decision step 1802, resolver 502 (FIG. 10) determines whether any VBSs of the zone of zone header 1004 have yet to post data for the current resolution of the simulated state of bus 104 (FIG. 1). Resolver 502 (FIG. 10) makes such a determination by comparing data stored in all posted flag 1108 (FIG. 11) to data representing a logical value of "true." If any VBSs of the current zone have yet to post data for the current resolution of the simulated state of bus 104 (FIG. 1), processing transfers from decision step 1802 (FIG. 18) to step 1804 in which resolver 502 (FIG. 10) signals the currently reaping VBS to suspend execution and records as the state of the currently reaping VBS reap stopped state 304 (FIG. 3). As described more completely below, data representing resolve simulated bus signals are included in a signal message by which execution of the stopped reaping VBS is resumed. Processing according to logic flow diagram 1406 (FIG. 18) completes after step 1804.

If, in decision step 1802, resolver 502 (FIG. 10) determines that all VBSs of the current zone have posted data for the current resolution of the simulated state of bus 104 (FIG. 1), subject simulated line from the perspective of circuit models 202A–B (FIG. 5). By copying data processing transfers from decision step 1802 (FIG. 18) to decision step 1806. In decision step 1806, resolver 502 (FIG. 10) determines whether the currently reaping VBS is the last VBS to reap data representing the most recently completed resolution of a simulated state of bus 104 (FIG. 1). Resolver 502 (FIG. 10) makes such a determination by incrementing the value of the data stored in reap count field 1106 and comparing the incremented value to the total number of VBSs of the current zone, e.g., the zone of zone header 1004, as represented by data stored in VBS count field 1102. By incrementing the value of the data stored in reap. count field 1106 in making such a determination, resolver 502 accurately maintains in reap count field 1106 the number of VBSs of the current zone which have reaped data representing the most recently completed resolution of the simulated state of bus 104 (FIG. 1).

If the currently reaping VBS is the last VBS of the current zone to reap data representing the most recently completed resolution of the simulated state of bus 104 (FIG. 1), processing transfers from decision step 1806 (FIG. 18) to step 1808. Conversely, if the currently reaping VBS is the not last VBS of the current zone to reap data representing the most recently completed resolution of the simulated state of bus 104 (FIG. 1), processing transfers from decision step 1806 (FIG. 18) to step 1810, to which processing transfers from step 1808 and which is described more completely below, thereby bypassing performance of step 1808.

Figure 18:
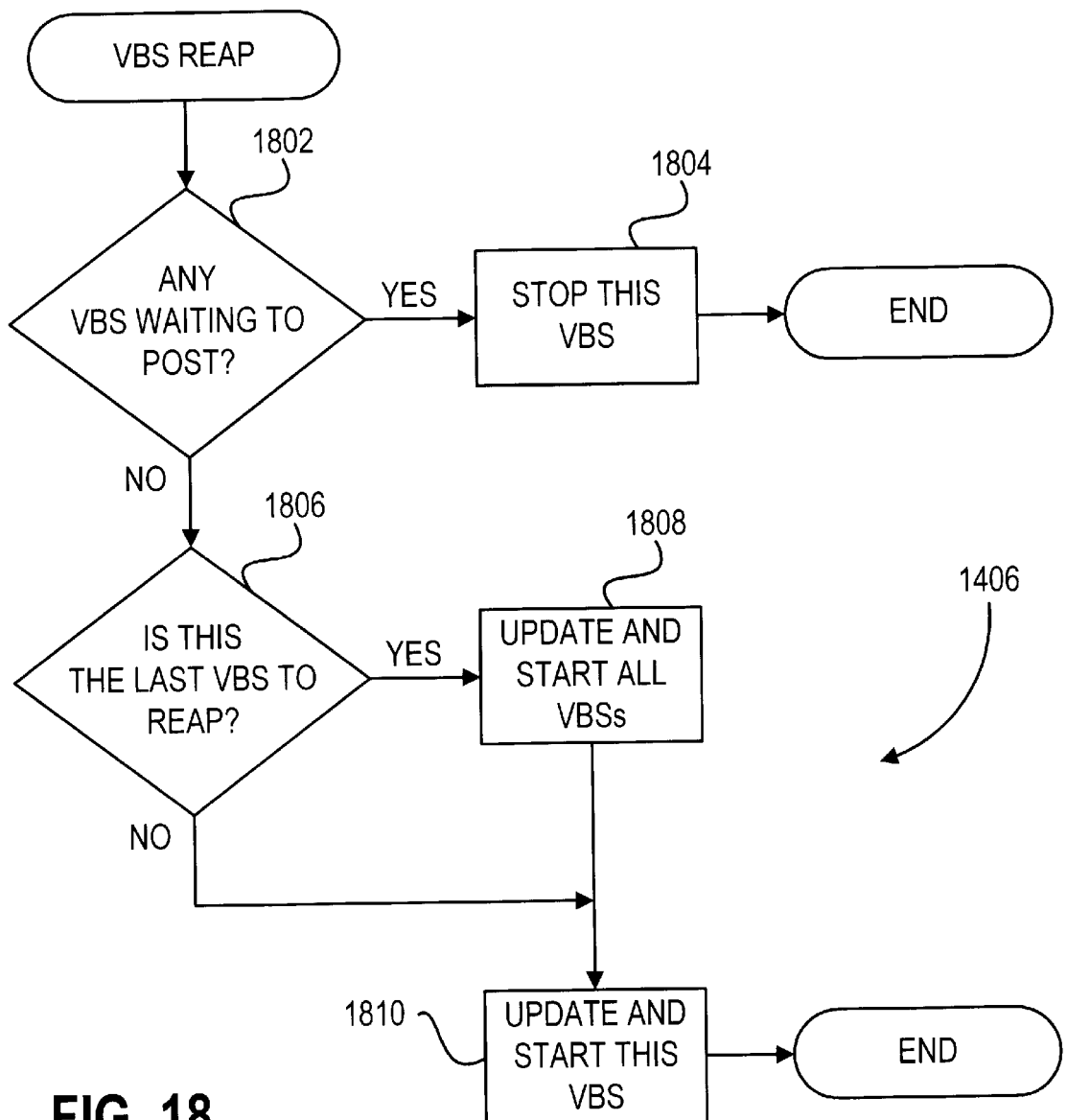
FIG. 18 is a logic flow diagram representing the processing of the hub of FIG. 5 in response to a reap signal received from a virtual bus stub.

In step 1808, resolver 502 (FIG. 10) updates and signals each of the VBSs stopped in step 1508 (FIG. 15) as described above to resume execution. Resolver 502 (FIG. 10) updates a VBS by recording in the resolve state field, e.g., resolve state field 1302 (FIG. 13) of the appropriate VBS state structure data representing post running state 306 (FIG. 3) and by including in the signal message by which execution of the updated VBS resume data representing the resolved simulated bus signals. Thus, when execution of the updated VBS is resumed, the VBS has successfully reaped data representing the resolved simulated bus signals. In step 1810 (FIG. 18), resolver 502 (FIG. 10) updates and signals the currently reaping VBS to resume execution in a directly analogous manner to that described with respect to step 1808 (FIG. 18). After step 1810, processing according to logic flow diagram 1406, and therefore step 1406 (FIG. 14), completes.

Thus, according to logic flow diagram 1400, resolver 502 (FIG. 5) processes signals from VBSs 204A–B and 206A–C to effect posting and reaping by such VBSs as shown in logic flow diagrams 1404 (FIG. 15) and 1406 (FIG. 18), respectively. With each simulated cycle of bus 104 (FIG. 1), (i) VBSs 204A–B (FIG. 5) each post data representing signals driven on bus 104 (FIG. 1) to resolver 502 (FIG. 5), (ii) resolver 502 resolves from the posted data a simulated state of bus 104 (FIG. 1), and (iii) VBSs 204A–B (FIG. 5) reap from resolver 502 data representing the resolved simulated state of bus 104 (FIG. 1). VBSs 204A–B (FIG. 5) and resolver 502 cooperate to collectively simulate bus 104 (FIG. 1) notwithstanding the distribution of VBSs 204A (FIG. 4) and 204B among different constituent computers 400A and 400B, respectively, of computer network 450. Since data is transferred between circuit parts 102A (FIG. 1) and 102B according to a bus protocol over bus 104, synchronization and cooperation between circuit parts 102A and 102B is inherent in the design of circuit parts 102A and 102B and therefore in circuit models 202A (FIG. 2) and 202B which simulate circuit parts 102A (FIG. 1) and 102B, respectively. Accordingly, distribution among constituent computers of computer network 450 (FIG. 4) of simulation of bus 104 provides a convenient and efficient division of a simulation of circuit 100 (FIG. 1).

The above description is illustrative only and is not limiting. The present invention is limited only by the claims which follow.

What is claimed is:

1. A method for preventing deadlock conditions between two or more bus stubs which collectively simulate a bus which connects two or more circuit parts of a circuit by periodically posting simulated bus signals and reaping resolved simulated bus signals, the method comprising:

suspending execution of a first of the two or more bus stubs which attempts to post simulated bus signals prior to reaping by a second of the two or more bus stubs of previously resolved simulated bus signals; and resuming execution of the first bus stub once all of the two or more bus stubs have reaped previously resolved simulated bus signals.

2. The method of claim 1 wherein a first of the two or more bus stubs executes within a first of two or more computers connected to form a computer network; and further wherein a second of the two or more bus stubs executes within a second of the two or more computers.

3. A method for preventing deadlock conditions between two or more bus stubs which collectively simulate a bus which connects two or more circuit parts of a circuit by periodically posting simulated bus signals and reaping resolved simulated bus signals, the method comprising:

suspending execution of a first of the two or more bus stubs which attempts to reap resolved simulated bus signals prior to posting by a second of the two or more bus stubs of simulated bus signals; and resuming execution of the first bus stub once all of the two or more bus stubs have posted simulated bus signals.

4. The method of claim 3 wherein a first of the two or more bus stubs executes within a first of two or more computers connected to form a computer network; and further wherein a second of the two or more bus stubs executes within a second of the two or more computers.

5. A method for simulating a circuit which includes two or more circuit parts, two or more selected ones of which communicate with one another through a bus, the method comprising:

simulating each of the two or more selected circuit parts;

for each of the two or more circuit parts, forming a corresponding bus stub which receives from the circuit part zero or more simulated bus signals and which transmits to the selected circuit part resolved simulated bus signals; and for each cycle of a simulated clock signal of the bus, resolving the zero or more signals received by the two or more bus stubs to form the resolved simulated bus signals wherein the step of resolving comprises:

posting to a resolver of the simulated bus signals by each of the two or more bus stubs;

resolving within the resolver of the resolved simulated bus signals;

reaping from the resolver of the resolved simulated bus signals by each of the two or more bus stubs;

suspending execution of a first of the two or more bus stubs which attempts to post simulated bus signals prior to reaping by a second of the two or more bus stubs of resolved simulated bus signals which correspond to a prior performance of the step of resolving; and resuming execution of the first bus stub once all of the two or more bus stubs have reaped resolved simulated bus signals which correspond to a prior performance of the step of resolving.

6. The method of claim 5 wherein a first of the two or more circuit parts is simulated on a first of two or more computers connected to form a computer network; and further wherein a second of the two or more circuit parts is simulated on a second of the two or more computers.

7. A method for simulating a circuit which includes two or more circuit parts, two or more selected ones of which communicate with one another through a bus, the method comprising:

simulating each of the two or more selected circuit parts;

for each of the two or more circuit parts, forming a corresponding bus stub which receives from the circuit part zero or more simulated bus signals and which transmits to the selected circuit part resolved simulated bus signals; and for each cycle of a simulated clock signal of the bus, resolving the zero or more signals received by the two or more bus stubs to form the resolved simulated bus signals wherein the step of resolving comprises:

posting to a resolver of the simulated bus signals by each of the two or more bus stubs;

resolving within the resolver of the resolved simulated bus signals;

reaping from the resolver of the resolved simulated bus signals by each of the two or more bus stubs;

suspending execution of a first of the two or more bus stubs which attempts to reap resolved simulated bus signals prior to posting by a second of the two or more bus stubs of simulated bus signals; and resuming execution of the first bus stub once all of the two or more bus stubs have posted simulated bus signals.

8. The method of claim 7 wherein a first of the two or more circuit parts is simulated on a first of two or more computers connected to form a computer network; and further wherein a second of the two or more circuit parts is simulated on a second of the two or more computers.

9. A computer program product comprising:
a computer usable medium having computer readable code embodied therein for preventing deadlock conditions between two or more bus stubs which collectively simulate a bus which connects two or more circuit parts of a circuit by periodically posting simulated bus signals and reaping resolved simulated bus signals, the computer readable code comprising:
 a stop module which is configured to suspend execution of a first of the two or more bus stubs which attempts to post simulated bus signals prior to reaping by a second of the two or more bus stubs of previously resolved simulated bus signals; and
 a start module which is operatively coupled to the stop module and which is configured to resume execution of the first bus stub once all of the two or more bus stubs have reaped previously resolved simulated bus signals.

10. The computer program product of claim 9 wherein a first of the two or more bus stubs executes within a first of two or more computers connected to form a computer network; and
further wherein a second of the two or more bus stubs executes within a second of the two or more computers.

11. A computer program product comprising:
a computer usable medium having computer readable code embodied therein for preventing deadlock conditions between two or more bus stubs which collectively simulate a bus which connects two or more circuit parts of a circuit by periodically posting simulated bus signals and reaping resolved simulated bus signals, the computer readable code comprising:
 a stop module which is configured to suspend execution of a first of the two or more bus stubs which attempts to reap resolved simulated bus signals prior to posting by a second of the two or more bus stubs of simulated bus signals; and
 a start module which is operatively coupled to the stop module and which is configured to resume execution of the first bus stub once all of the two or more bus stubs have posted simulated bus signals.

12. The computer program product of claim 11 wherein a first of the two or more bus stubs executes within a first of two or more computers connected to form a computer network; and
further wherein a second of the two or more bus stubs executes within a second of the two or more computers.

13. A computer program product comprising:
a computer usable medium having computer readable code embodied therein for simulating a circuit which includes two or more circuit parts, two or more selected ones of which communicate with one another through a bus, the computer readable code comprising:
 two or more circuit models, each of which is configured to simulate a respective one of the two or more selected circuit parts;
 two or more bus stubs, each of which is operatively coupled to a respective one of the circuit models and is configured to receive from the respective circuit model zero or more simulated bus signals and to transmit to the respective circuit model resolved simulated bus signals; and
 a resolver which is operatively coupled to the bus stubs and which is configured to resolve the zero or more signals received by each of the two or more bus stubs and to form the resolved simulated bus signals for each cycle of a simulated clock signal of the bus, wherein the resolver comprises:
  a post processing module which is configured to receive from each of the bus stubs the simulated bus signals of the bus stub;
  a signal resolving module which is operatively coupled to the post processing module and which is configured to resolve the simulated bus signals to form the resolved simulated bus signals;
  a reap processing module which is operatively coupled to the signal resolving module and which is configured to transfer to each of the bus stubs the resolved simulated bus signals;
  a stop module which is operatively coupled to the signal resolving module and which is configured to suspend execution of a first of the two or more bus stubs which attempts to post simulated bus signals prior to reaping by a second of the two or more bus stubs of resolved simulated bus signals previously resolved by the signal resolving module; and
  a start module which is operatively coupled to the signal resolving module and which is configured to resume execution of the first bus stub once all of the two or more bus stubs have reaped resolved simulated bus signals previously resolved by the signal resolving module.

14. The computer program product of claim 13 wherein a first of the two or more circuit models executes on a first of two or more computers connected to form a computer network; and
further wherein a second of the two or more circuit models executes on a second of the two or more computers.

15. A computer program product comprising:
a computer usable medium having computer readable code embodied therein for simulating a circuit which includes two or more circuit parts, two or more selected ones of which communicate with one another through a bus, the computer readable code comprising:
 two or more circuit models, each of which is configured to simulate a respective one of the two or more selected circuit parts;
 two or more bus stubs, each of which is operatively coupled to a respective one of the circuit models and is configured to receive from the respective circuit model zero or more simulated bus signals and to transmit to the respective circuit model resolved simulated bus signals; and
 a resolver which is operatively coupled to the bus stubs and which is configured to resolve the zero or more signals received by each of the two or more bus stubs and to form the resolved simulated bus signals for each cycle of a simulated clock signal of the bus, wherein the resolver comprises:
  a post processing module which is configured to receive from each of the bus stubs the simulated bus signals of the bus stub;
  a signal resolving module which is operatively coupled to the post processing module and which is configured to resolve the simulated bus signals to form the resolved simulated bus signals;
  a reap processing module which is operatively coupled to the signal resolving module and which is configured to transfer to each of the bus stubs the resolved simulated bus signals;

a stop module which is operatively coupled to the signal resolving module and which is configured to suspend execution of a first of the two or more bus stubs which attempts to reap resolved simulated bus signals prior to posting by a second of the two or more bus stubs of simulated bus signals; and a start module which is operatively coupled to the signal resolving module and which is configured to resume execution of the first bus stub once all of the two or more bus stubs have posted simulated bus signals.

16. The computer program product of claim 15 wherein a first of the two or more circuit models executes on a first of two or more computers connected to form a computer network; and further wherein a second of the two or more circuit models executes on a second of the two or more computers.

* * * * *